(12) United States Patent
Kishimoto et al.

(10) Patent No.: US 7,691,225 B2
(45) Date of Patent: Apr. 6, 2010

(54) THERMAL-RELEASE DOUBLE-COATED PRESSURE-SENSITIVE ADHESIVE TAPE OR SHEET AND METHOD OF PROCESSING ADHEREND

(75) Inventors: Tomoko Kishimoto, Ibaraki (JP); Yukio Arimitsu, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 125 days.

(21) Appl. No.: 12/007,113

(22) Filed: Jan. 7, 2008

(65) Prior Publication Data

US 2008/0169062 A1 Jul. 17, 2008

(30) Foreign Application Priority Data

Jan. 15, 2007 (JP) .............................. 2007-005344

(51) Int. Cl.
*B32B 38/00* (2006.01)
*B32B 33/00* (2006.01)
(52) U.S. Cl. .................... 156/325; 428/354; 156/280
(58) Field of Classification Search ................. 156/325, 156/280
See application file for complete search history.

(56) References Cited

U.S. PATENT DOCUMENTS

2005/0107547 A1\* 5/2005 Ohno et al. ............... 525/329.7

FOREIGN PATENT DOCUMENTS

| DE | 11 2005 003 116 | 11/2008 |
|----|------------------|---------|
| EP | 1724319 | 11/2006 |
| EP | 1724320 | 11/2006 |
| JP | 56-061468 | 5/1981 |
| WO | WO 2006/062197 | 6/2006 |

OTHER PUBLICATIONS

Jürgen Falbe, Manfred Regitz, "Römpp Chemie Lexikon," Georg Thieme Verlag, 1992, pp. 5017-5020.
European Search Report mailed May 15, 2008, issued on the European Application No. 08 00 0305.

\* cited by examiner

*Primary Examiner*—Khanh Nguyen
*Assistant Examiner*—Margaret Brodie
(74) *Attorney, Agent, or Firm*—Edwards Angell Palmer & Dodge LLP

(57) ABSTRACT

Disclosed is a thermal-release double-coated pressure-sensitive adhesive tape or sheet which includes a substrate, a foaming agent-free pressure-sensitive adhesive layer (A) arranged on one side of the substrate, and a foaming agent-containing pressure-sensitive adhesive layer (B) arranged on the other side. The pressure-sensitive adhesive layer (A) contains 5 to 30 parts by weight of a plasticizer and 100 parts by weight of a base polymer and has a tensile adhesive strength of 1 N/20 mm in width or less with respect to a poly(ethylene terephthalate) film as determined at a peel angle of 180 degrees, a rate of pulling of 300 mm/minute, a temperature of 23±2° C., and a relative humidity of 65±5%. The weight loss of plasticizer is 2 percent by weight or less when the tape or sheet is heated at a temperature of 165° C. and a pressure of one atmosphere for one hour.

18 Claims, 1 Drawing Sheet

THERMAL-RELEASE DOUBLE-COATED PRESSURE-SENSITIVE ADHESIVE TAPE OR SHEET AND METHOD OF PROCESSING ADHEREND

BACKGROUND OF THE INVENTION

1. Field of the Invention

The present invention relates to thermal-release double-coated pressure-sensitive adhesive tapes or sheets, and methods of processing adherends using them.

2. Description of the Related Art

There have been known thermal-release pressure-sensitive adhesive tapes or sheets which include a substrate (carrier), and a pressure-sensitive adhesive layer containing a foaming agent such as heat-expandable microspheres (heat-expandable pressure-sensitive adhesive layer), and being arranged on the substrate (e.g., Japanese Unexamined Patent Application Publication (JP-A) No. S56-61468). Such thermal-release pressure-sensitive adhesive tapes or sheets are configured to make it possible to easily separate an article as an adherend easily after accomplishment of the purpose of bonding of the article. This is achieved in the following manner. The heat-expandable pressure-sensitive adhesive layer is heated to foam or expand, whereby the heat-expandable pressure-sensitive adhesive layer has an uneven surface to have a smaller adhesion area with the adherend and to have a reduced adhesive strength (adhesive force). Thus, the adherend can be easily separated from the tape or sheet. These thermal-release pressure-sensitive adhesive tapes or sheets are therefore widely used in purposes of every kind. They are used, for example, for fixing electronic components or materials thereof during processing, or for carrying out physical distribution such as transportation.

For example, the thermal-release pressure-sensitive adhesive tapes or sheets may be a double-coated type thermal-release pressure-sensitive adhesive tape or sheet (thermal-release double-coated pressure-sensitive adhesive tape or sheet). The tapes or sheets include a substrate, a pressure-sensitive adhesive layer containing a foaming agent (foaming agent-containing pressure-sensitive adhesive layer), arranged on one side of the substrate, and a pressure-sensitive adhesive layer containing no foaming agent (foaming agent-free pressure-sensitive adhesive layer), arranged on the other side of the substrate. The thermal-release double-coated pressure-sensitive adhesive tape or sheet is generally used in the following manner. An article to be processed is affixed to the surface of the foaming agent-containing pressure-sensitive adhesive layer serving as a thermal-release pressure-sensitive adhesive layer; and the foaming agent-free pressure-sensitive adhesive layer not serving as a thermal-release pressure-sensitive adhesive layer is affixed to the surface of a pedestal. After processing the article affixed to the pedestal through the tape or sheet, the processed article is released from the thermal-release double-coated pressure-sensitive adhesive tape or sheet by heating, and the thermal-release double-coated pressure-sensitive adhesive tape or sheet is then removed from the pedestal. In this case, the pedestal released from the thermal-release double-coated pressure-sensitive adhesive tape or sheet is reusable.

SUMMARY OF THE INVENTION

However, if the thermal-release double-coated pressure-sensitive adhesive tape or sheet has an excessively high adhesive strength in a pressure-sensitive adhesive layer to be fixed to the pedestal (i.e., the foaming agent-free pressure-sensitive adhesive layer), it takes much time to remove the thermal-release double-coated pressure-sensitive adhesive tape or sheet from the pedestal, and the pedestal may be damaged in some cases. In contrast, if the thermal-release double-coated pressure-sensitive adhesive tape or sheet has an excessively low adhesive strength in the foaming agent-free pressure-sensitive adhesive layer, the tape or sheet may not be sufficiently fixed to the pedestal, whereby the article may not be satisfactorily processed.

When the article to be processed is an electronic component or a material therefor, it is important to avoid contamination of the article during processing. Therefore, it is important that a thermal-release double-coated pressure-sensitive adhesive tape or sheet to be used in this case should inhibit or prevent from the contamination of an electronic component or a material therefor as the article.

Accordingly, an object of the present invention is to provide a thermal-release double-coated pressure-sensitive adhesive tape or sheet which includes a foaming agent-containing pressure-sensitive adhesive layer capable of removing or releasing through heating, and a foaming agent-free pressure-sensitive adhesive layer, in which the foaming agent-free pressure-sensitive adhesive layer has such an adhesive strength that the tape or sheet can be securely fixed during use (processing) and can be easily removed by peeling when the tape or sheet should be removed.

Another object of the present invention is to provide a thermal-release double-coated pressure-sensitive adhesive tape or sheet which inhibits or prevents substantially from the contamination of an article to be affixed to a foaming agent-containing pressure-sensitive adhesive layer or the contamination of the processed article after processing.

After intensive investigations, the present inventors have found that, by using a foaming agent-free pressure-sensitive adhesive layer containing a predetermined amount of a plasticizer and having a specific tensile adhesive strength and by adjusting a pressure-sensitive adhesive double-coated tape or sheet to have a loss in weight of plasticizer on heating within a predetermined range, the foaming agent-free pressure-sensitive adhesive layer can have a suitable adhesive strength so that the tape or sheet can be adhered tightly during use and have an adhesive strength suitably reduced to such an extent that the tape or sheet can be easily removed by peeling upon removal, and, in addition, the contamination of the adherend can be effectively suppressed or prevented. The present invention has been made based on these findings.

Specifically, according to the present invention, there is provided thermal-release double-coated pressure-sensitive adhesive tape or sheet which includes a substrate; a pressure-sensitive adhesive layer (A) containing no foaming agent and being arranged on or above one side of the substrate; and another pressure-sensitive adhesive layer (B) containing a foaming agent and being arranged on or above the other side of the substrate. In the tape or sheet, the pressure-sensitive adhesive layer (A) contains 5 to 30 parts by weight of a plasticizer; and 100 parts by weight of a base polymer and has a tensile adhesive strength of 1 N/20 mm in width or less with respect to a poly(ethylene terephthalate) film as determined at a peel angle of 180 degrees, a rate of pulling of 300 mm/minute, a temperature of 23±2° C., and a relative humidity of 65±5%. The pressure-sensitive adhesive double-coated tape or sheet has a loss in weight of the plasticizer of 2 percent by weight or less upon heating of the pressure-sensitive adhesive double-coated tape or sheet at a temperature of 165° C. and a pressure of one atmosphere for one hour.

The thermal-release double-coated pressure-sensitive adhesive tape or sheet includes a foaming agent-containing pressure-sensitive adhesive layer which is removable or releasable through heating, and a foaming agent-free pressure-sensitive adhesive layer. The foaming agent-free pressure-sensitive adhesive layer has such a suitable adhesive strength as to affix securely during use and to remove easily by peeling.

The plasticizer preferably has the following Property (X) and/or Properties (Y):

Property (X): a loss in weight of 2 percent by weight or less upon heating at a temperature of 165° C. and a pressure of one atmosphere for one hour; and Properties (Y): a pressure of saturated vapor at 100° C. of 0.09 Pa or less and a boiling point of 400° C. or higher.

Thus, the contamination of an article to be affixed to the foaming agent-containing pressure-sensitive adhesive layer or the contamination of a processed article after processing are more effectively suppressed or prevented.

The plasticizer preferably has a molecular weight or weight-average molecular weight of 500 or more. In particular, trimellitic ester plasticizers or pyromellitic ester plasticizers are preferably used as the plasticizer.

In the thermal-release double-coated pressure-sensitive adhesive tape or sheet of the present invention, it is desirable that the pressure-sensitive adhesive layer (A) has a shear adhesive strength of X (N/cm$^2$) with respect to a SUS 304BA stainless steel sheet in an adhesion area of 20 mm wide and 20 mm long as determined at a rate of pulling in a shear direction of 50 mm/minute, a temperature of 23±2° C., and a relative humidity of 65±5% and has a tensile adhesive strength of Y (N/20 mm in width) with respect to a poly(ethylene terephthalate) film as determined at a peel angle of 180 degrees, a rate of pulling of 300 mm/minute, a temperature of 23±2° C., and a relative humidity of 65±5%, and the ratio of X to Y (X/Y) is 20 or more. Preferably, the pressure-sensitive adhesive layer (A) has a shear adhesive strength of 10 (N/cm$^2$) or more with respect to a SUS 304BA stainless steel sheet in an adhesion area of 20 mm wide and 20 mm long as determined at a rate of pulling in a shear direction of 50 mm/minute, a temperature of 23±2° C., and a relative humidity of 65±5%. The pressure-sensitive adhesive layer (A) preferably has a gel fraction of 75 percent by weight or more.

In the present invention, there is provided a method of processing an adherend using a pressure-sensitive adhesive double-coated tape or sheet. The method includes the steps of fixing the thermal-release double-coated pressure-sensitive adhesive tape or sheet of the present invention to a pedestal through the pressure-sensitive adhesive layer (A); affixing the adherend to the pressure-sensitive adhesive layer (B) of the thermal-release double-coated pressure-sensitive adhesive tape or sheet; and carrying out processing of the adherend affixed to the pressure-sensitive adhesive layer (B) of the tape or sheet fixed to the pedestal. This method is preferably applied to an electronic component or an analogue thereto as the adherend. The method may be applied to a green sheet for a ceramic capacitor and may further include the step of stacking, on the green sheet, another green sheet.

In the present invention, an electronic component and a multilayer ceramic capacitor may be fabricated by using the method which is preferably applied to the electronic component or the analogue thereto as the adherend.

Figure 1A:
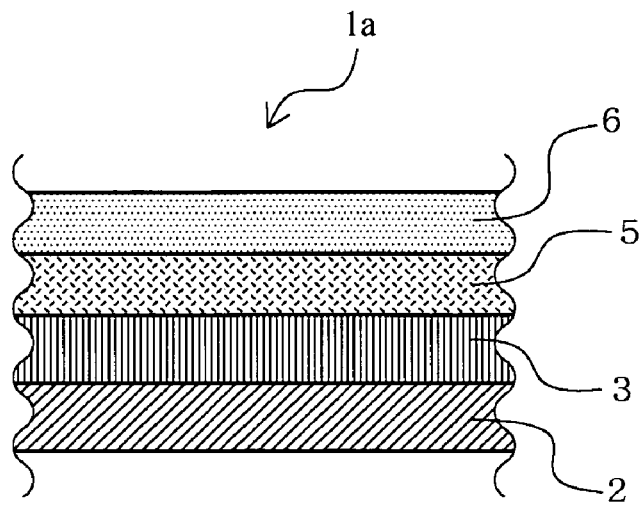
FIGS. 1A and 1B are schematic cross-sectional views partially illustrating thermal-release double-coated pressure-sensitive adhesive tapes or sheets according to the present invention.

BRIEF DESCRIPTION OF THE SYMBOLS 1a, 1b Thermal-release double-coated pressure-sensitive adhesive tape or sheet
2 Pressure-sensitive adhesive layer (A) which does not contain a foaming agent [Foaming agent-free pressure-sensitive adhesive layer (A)]
3 Substrate
4 Organic rubber-like elastic layer
5 Pressure-sensitive adhesive layer which contains a foaming agent [Foaming agent-containing pressure-sensitive adhesive layer (B)]
6 Separator (release liner) which has release surfaces on both sides
7 Thermal-release double-coated pressure-sensitive adhesive tape or sheet
7a Pulling direction of the thermal-release double-coated pressure-sensitive adhesive tape or sheet 7
8 SUS 304 BA stainless steel sheet
8a Pulling direction of the SUS 304 BA stainless steel sheet 8

DESCRIPTION OF THE PREFERRED EMBODIMENTS

Some embodiments of the present invention will be illustrated below, with reference to the attached drawings according to necessity. Identical members or portions may have identical reference numerals.

[Thermal-Release Double-Coated Pressure-Sensitive Adhesive Tape or Sheet]

Figure 1B:
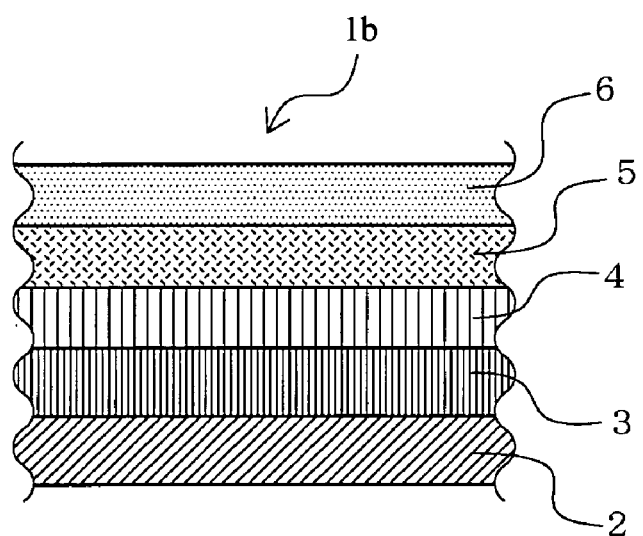

With reference to FIGS. 1A and 1B, a thermal-release double-coated pressure-sensitive adhesive tape or sheet according to the present invention includes a substrate; a pressure-sensitive adhesive layer (A) which is arranged on one side of the substrate and does not contain a foaming agent [foaming agent-free pressure-sensitive adhesive layer (A)]; and a pressure-sensitive adhesive layer (B) which is arranged on the other side of the substrate and contains at least one foaming agent [foaming agent-containing pressure-sensitive adhesive layer (B)]. The foaming agent-free pressure-sensitive adhesive layer (A) contains 5 to 30 parts by weight of a plasticizer and 100 parts by weight of a base polymer constituting the foaming agent-free pressure-sensitive adhesive layer (A). The foaming agent-free pressure-sensitive adhesive layer (A) has a tensile adhesive strength of 1 N/20 mm in width or less with respect to a poly(ethylene terephthalate) film as determined at a peel angle of 180 degrees, a rate of pulling of 300 mm/minute, a temperature of 23±2° C., and a relative humidity of 65±5%. In addition, the pressure-sensitive adhesive double-coated tape or sheet has a loss in weight of plasticizer of 2 percent by weight or less when the pressure-sensitive adhesive double-coated tape or sheet itself is heated at a temperature of 165° C. and a pressure of one atmosphere for one hour FIGS. 1A and 1B are schematic cross-sectional views partially illustrating thermal-release double-coated pressure-sensitive adhesive tapes or sheets according to the present invention. In FIGS. 1A and 1B, each of "1a" and "1b" represents a thermal-release double-coated pressure-sensitive adhesive tape or sheet; "2" represents a pressure-sensitive adhesive layer (A) which does not contain a foaming agent [foaming agent-free pressure-sensitive adhesive layer (A)];

"3" represents a substrate; "4" represents an organic rubber-like elastic layer; "5" represents a pressure-sensitive adhesive layer which contains a foaming agent [foaming agent-containing pressure-sensitive adhesive layer (B)]; and "6" represents a separator (release liner) which has release surfaces on both sides. The foaming agent-free pressure-sensitive adhesive layer (A) contains a plasticizer in an amount of 5 to 30 parts by weight to 100 parts by weight of a base polymer constituting the foaming agent-free pressure-sensitive adhesive layer (A). The foaming agent-free pressure-sensitive adhesive layer (A) has a tensile adhesive strength 1 N/20 mm in width or less with respect to a poly(ethylene terephthalate) film as determined at a peel angle of 180 degrees, a rate of pulling of 300 mm/minute, a temperature of 23±2° C., and a relative humidity of 65±5%. In addition, the thermal-release double-coated pressure-sensitive adhesive tape or sheet has a loss in weight of plasticizer of 2 percent by weight or less upon when the tape or sheet is heated at a temperature of 165° C. and a pressure of one atmosphere for one hour.

Specifically, the thermal-release double-coated pressure-sensitive adhesive tape or sheet 1a in FIG. 1A has a structure in which a foaming agent-free pressure-sensitive adhesive layer (A) 2 is arranged on one side of a substrate 3, and a foaming agent-containing pressure-sensitive adhesive layer (B) 5 is arranged on the other side of the substrate 3. The thermal-release double-coated pressure-sensitive adhesive tape or sheet 1b in FIG. 1B has a structure in which a foaming agent-free pressure-sensitive adhesive layer (A) 2 is arranged on one side of a substrate 3, and an organic rubber-like elastic layer 4 and a foaming agent-containing pressure-sensitive adhesive layer (B) 5 are arranged in this order on the other side of the substrate 3. In these thermal-release double-coated pressure-sensitive adhesive tapes or sheets (1a and 1b), the surface of the foaming agent-containing pressure-sensitive adhesive layer (B) 5 is protected by a separator 6 which has release surfaces on both sides. Thermal-release pressure-sensitive adhesive double-coated tapes wound as rolls are prepared by winding them into rolls so as to contact the surface of the foaming agent-free pressure-sensitive adhesive layer (A) 2 and the exposed surface of the separator 6.

Such thermal-release double-coated pressure-sensitive adhesive tapes or sheets according to the present invention can tightly adhere (particularly adhere to be fixed) to a support such as a pedestal using the foaming agent-free pressure-sensitive adhesive layer (A) when they should be fixed to the support by affixation. After use, they can be easily removed by peeling from the support to which they have been affixed. This is because, in these tapes or sheets, the foaming agent-free pressure-sensitive adhesive layer (A) contains a plasticizer in a specific amount of 5 to 30 parts by weight to 100 parts by weight of a base polymer; and the foaming agent-free pressure-sensitive adhesive layer (A) has a suitable tensile adhesive strength of 1 N/20 mm in width or less with respect to a poly(ethylene terephthalate) film as determined at a peel angle of 180 degrees, a rate of pulling of 300 mm/minute, a temperature of 23±2° C., and a relative humidity of 65±5%.

In the thermal-release double-coated pressure-sensitive adhesive tapes or sheets of the present invention, the foaming agent-free pressure-sensitive adhesive layer (A) contains a specific amount of the plasticizer and thereby has a tensile adhesive strength reduced or controlled within a suitable range.

In addition, the thermal-release double-coated pressure-sensitive adhesive tapes or sheets is effectively suppressed or prevented from the contamination of an article affixed to the foaming agent-containing pressure-sensitive adhesive layer upon processing, or after processing, even though the foaming agent-free pressure-sensitive adhesive layer (A) contains a plasticizer so as to have an adhesive strength (tensile adhesive strength) reduced or controlled within a suitable range. This is because the thermal-release double-coated pressure-sensitive adhesive tapes or sheets have a loss in weight of plasticizer of 2 percent by weight or less upon heating of the tape or sheet at a temperature of 165° C. and a pressure of one atmosphere for one hour; and accordingly the plasticizer is suppressed or prevented from diffusion and volatilization when the article is affixed to the surface of the foaming agent-containing pressure-sensitive adhesive layer serving as a thermal-release pressure-sensitive adhesive layer and then subjected to processing, in particular subjected to processing at high temperatures, and when the article is released from the foaming agent-containing pressure-sensitive adhesive layer by heating after the processing.

These thermal-release double-coated pressure-sensitive adhesive tapes or sheets may be controlled to have a loss in weight of plasticizer of 2 percent by weight or less upon heating of the tapes or sheets at a temperature of 165° C. and a pressure of one atmosphere for one hour, for example, by using, as a plasticizer, one having following Property (X) and/or Properties (Y):

Property (X): a loss in weight of 2 percent by weight or less upon heating at a temperature of 165° C. and a pressure of one atmosphere for one hour; and Properties (Y): a pressure of saturated vapor at 100° C. of 0.09 Pa or less and a boiling point of 400° C. or higher.

Specifically, a thermal-release double-coated pressure-sensitive adhesive tape or sheet according to the present invention may be prepared by forming a foaming agent-free pressure-sensitive adhesive layer (A) using a pressure-sensitive adhesive composition which contains 100 parts by weight of a base polymer to constitute the foaming agent-free pressure-sensitive adhesive layer (A), and 5 to 30 parts by weight of a plasticizer having Property (X) and/or Properties (Y). This thermal-release double-coated pressure-sensitive adhesive tape or sheet has a tensile adhesive strength of the pressure-sensitive adhesive layer (A) of 1 N/20 mm in width or less with respect to a poly(ethylene terephthalate) film as determined at a peel angle of 180 degrees, a rate of pulling of 300 mm/minute, a temperature of 23±2° C., and a relative humidity of 65±5%, and the pressure-sensitive adhesive double-coated tape or sheet also has a loss in weight of plasticizer of 2 percent by weight or less upon heating of the pressure-sensitive adhesive double-coated tape or sheet at a temperature of 165° C. and a pressure of one atmosphere for one hour.

The tensile adhesive strength of the foaming agent-free pressure-sensitive adhesive layer (A) is not particularly limited as long as it is 1 N/20 mm in width or less, and is, for example, 0.1 to 1 N/20 mm in width, preferably 0.8 N/20 mm in width or less, for example, 0.3 to 0.8 N/20 mm in width. The tensile adhesive strength herein is determined with respect to a poly(ethylene terephthalate) film at a peel angle of 180 degrees, a rate of pulling of 300 mm/minute, a temperature of 23±2° C., and a relative humidity of 65±5%. If the tensile adhesive strength of the foaming agent-free pressure-sensitive adhesive layer (A) exceeds 1 N/20 mm in width, the tape or sheet may have reduced releasability from a support to which the tape or sheet is affixed, and it may be difficult to remove the tape or sheet from the support by peeling. If the tensile adhesive strength of the foaming agent-free pressure-sensitive adhesive layer (A) is excessively low of less than about 0.1 N/20 mm in width, the tape or sheet may not be satisfactorily fixed to a support such as a pedestal, and the tape or sheet may be likely to peel from the support during processing of an article which is affixed to the foaming agent-containing pressure-sensitive adhesive layer (B) or during heating for releasing a processed article after the processing.

In the present invention, the "tensile adhesive strength" of the foaming agent-free pressure-sensitive adhesive layer (A) with respect to a poly(ethylene terephthalate) film as determined at a peel angle of 180 degrees, a rate of pulling of 300 mm/minute, a temperature of 23±2° C., and a relative humidity of 65±5% herein is defined as a value measured according to the following method of measuring tensile adhesive strength.

[Method of Measuring Tensile Adhesive Strength]

A sample thermal-release double-coated pressure-sensitive adhesive tape or sheet is cut to a piece 20 mm wide and 140 mm long, and the piece (20 mm wide and 140 mm long) is adhered under pressure to a poly(ethylene terephthalate) film (supplied from Toray Industries, Inc. under the trade name of "Lumirror S-10"; thickness: 25 µm, width: 30 mm) so that an adhesive surface of the foaming agent-free pressure-sensitive adhesive layer (A) is in contact with a surface of the adhesive surface of the poly(ethylene terephthalate) film, according to a procedure as described in Japanese Industrial Standards (JIS) Z 0237, by allowing a 2-kg roller to move to and fro thereon once in an atmosphere at a temperature of 23±2° C. and a relative humidity of 65±5%. The resultant film adhered with the sample tape or sheet is kept in an atmosphere at a temperature of 23±2° C. and a relative humidity of 65±5% for thirty minutes, then, the poly(ethylene terephthalate) film is removed by peeling from the thermal-release double-coated pressure-sensitive adhesive tape or sheet in an atmosphere at a temperature of 23±2° C. and a relative humidity of 65±5%, at a peel angle of 180 degrees and a rate of pulling of 300 mm/minute. The stress upon removal is measured, the maximum of stress (maximum of stress other than a peak top in the initial stages of measurement) is read out, and the maximum of stress is defined as the adhesive strength (N/20 mm in width).

The loss in weight of plasticizer(s) contained in the entire thermal-release double-coated pressure-sensitive adhesive tape or sheet is not particularly limited as long as it is 2 percent by weight or less, but is preferably 1 percent by weight or less, more preferably 0.5 percent by weight or less, typically preferably 0.3 percent by weight or less, and particularly preferably 0 percent by weight. The loss in weight of plasticizer(s) herein is determined upon heating of the thermal-release double-coated pressure-sensitive adhesive tape or sheet at a temperature of 165° C. and a pressure of one atmosphere for one hour. If the loss in weight of plasticizer exceeds 2 percent by weight, contamination of an article or a processed article may occur when the article which has been affixed to the foaming agent-containing pressure-sensitive adhesive layer (B) is processed or when the processed article is released from the foaming agent-containing pressure-sensitive adhesive layer (B).

In the present invention, the "loss in weight of plasticizer" upon heating of the thermal-release double-coated pressure-sensitive adhesive tape or sheet at a temperature of 165° C. and a pressure of one atmosphere for one hour is defined as the value determined according to the following method of measuring loss in weight on heating.

[Method of Measuring Loss in Weight on Heating]

A sample thermal-release double-coated pressure-sensitive adhesive tape or sheet [area: 10 cm$^2$ (width: 20 mm, length: 50 mm)] after removing the separator is placed in a vial; heated at a temperature of 165° C. and a pressure of one atmosphere for one hour; the weight of the plasticizer which has vaporized or evaporated during heating is measured by injecting 1.0 mL of a gas under heating into a gas chromatographic system and by carrying out gas chromatography under the following conditions; and the loss in weight of plasticizer(s) in the thermal-release double-coated pressure-sensitive adhesive tape or sheet is determined by calculation.

[Conditions for Gas Chromatographic Measurement]

Carrier gas and flow rate thereof: helium (He) gas, 7.9 mL/minute

Column head pressure: 34.5 kPa (at 40° C.)

Temperature at injection port: 280° C.

Column temperature: at 40° C. for 5 minutes, elevated at a rate of 10° C./minute, and at 260° C. for 13 minutes Detector: frame ionization detector (FID) (280° C.)

Pressurization time: 0.12 minute

Loop filling time: 0.12 minute

Loop equilibration time: 0.12 minute

Injection time: 3.00 minute

Temperature of sample loop: 200° C.

Temperature of transfer line: 220° C.

[Foaming Agent-Free Pressure-Sensitive Adhesive Layer (A)]

The foaming agent-free pressure-sensitive adhesive layer (A) is a pressure-sensitive adhesive layer which does not contain a foaming agent and is neither expandable nor foamable by heating. Specifically, the foaming agent-free pressure-sensitive adhesive layer (A) does not serve as a thermal-release pressure-sensitive adhesive layer. This foaming agent-free pressure-sensitive adhesive layer (A) at least contains 100 parts by weight of a base polymer for constituting a pressure-sensitive adhesive, and 5 to 30 parts by weight of a plasticizer. If the plasticizer content is less than 5 parts by weight to 100 parts by weight of the base polymer in the foaming agent-free pressure-sensitive adhesive layer (A), the adhesive strength of the foaming agent-free pressure-sensitive adhesive layer (A) may not be effectively reduced. In contrast, if it exceeds 30 parts by weight, the plasticizer may excessively separate or precipitate out in the surface of the foaming agent-free pressure-sensitive adhesive layer (A) and may cause contamination of an article or a processed article, or the foaming agent-free pressure-sensitive adhesive layer (A) may have an excessively low adhesive strength and may often cause lifting from an adherend such as a pedestal. The foaming agent-free pressure-sensitive adhesive layer (A) preferably contains 8 to 25 parts by weight of a plasticizer to 100 parts by weight of a base polymer constituting the foaming agent-free pressure-sensitive adhesive layer (A).

One or more plasticizers having above-mentioned Property (X) and/or Properties (Y) are preferably used as the plasticizer.

In Property (X), the loss in weight of plasticizer is not particularly limited as long as it is 2 percent by weight or less, but is preferably 1 percent by weight or less, more preferably 0.5 percent by weight or less, further more preferably 0.3 percent by weight or less, and particularly preferably 0 percent by weight, as determined upon heating at a temperature of 165° C. and a pressure of one atmosphere for one hour.

In Properties (Y), the pressure of saturated vapor of the plasticizer at 100° C. is not particularly limited as long as it is 0.09 Pa or less, but is preferably $1.0 \times 10^{-3}$ Pa or less, more preferably $4.2 \times 10^{-4}$ Pa or less, and particularly preferably $1.0 \times 10^{-4}$ Pa or less. The pressure of saturated vapor of the plasticizer at 100° C. is not especially limited in its lower limit, and it is preferably minimized.

The boiling point of the plasticizer in Properties (Y) is not particularly limited as long as it is 400° C. or higher, but is preferably 410° C. or higher, and more preferably 420° C. or higher. The boiling point of the plasticizer is not particularly limited in its upper limit, and the higher the boiling point is, the better.

The "loss in weight of plasticizer" in the foaming agent-free pressure-sensitive adhesive layer (A) as determined upon heating at a temperature of 165° C. and a pressure of one atmosphere for one hour is defined herein as the value determined according to the following method of measuring loss in weight on heating in pressure-sensitive adhesive layer (A).

[Method of Measuring Loss in Weight on Heating in Pressure-Sensitive Adhesive Layer (A)]

About 10 cm$^2$ of a foaming agent-free pressure-sensitive adhesive layer (A) is sampled; the sample is placed in a vial; heated at a temperature of 165° C. and a pressure of one atmosphere for one hour; the weight of the plasticizer which has vaporized or evaporated during heating is measured by injecting 1.0 mL of a gas under heating into a gas chromatographic system and by carrying out gas chromatography under the same conditions for gas chromatographic measurement in the above-mentioned method of measuring loss in weight on heating of the tape or sheet; and the loss in weight of plasticizer in the foaming agent-free pressure-sensitive adhesive layer (A) is determined by calculation.

As is described above, the contamination of an article or a processed article can be effectively suppressed or prevented by using, as the plasticizer, a plasticizer having Property (X) and/or Properties (Y). This is because the plasticizer is suppressed or prevented from vaporization or volatilization even in an atmosphere at high temperatures, and the plasticizer does not at all or substantially not at all vaporize or volatilize, for example, when the article which has been affixed to the foaming agent-containing pressure-sensitive adhesive layer (B) is processed or when the processed article after processing is heated and thereby released. In addition, upon manufacturing of the thermal-release double-coated pressure-sensitive adhesive tape or sheet, the contamination of manufacturing devices such as air filters can be surpassed or prevented, and a thermal-release double-coated pressure-sensitive adhesive tape or sheet having stable properties can be manufactured. This is because the plasticizer does not at all or substantially not at all vaporize or volatilize when the pressure-sensitive adhesive is applied or dried.

Plasticizers having both Property (X) and Properties (Y) are preferably used in the present invention. In addition, plasticizers having good compatibility with a base polymer of a pressure-sensitive adhesive for constituting the foaming agent-free pressure-sensitive adhesive layer (A) are preferred.

Specific examples of plasticizers for use herein include trimellitic ester plasticizers, pyromellitic ester plasticizers, polyester plasticizers, and adipic acid plasticizers, of which trimellitic ester plasticizers and pyromellitic ester plasticizers are preferred. Each of the plasticizers can be used alone or in combination.

Preferred examples of the trimellitic ester plasticizers and pyromellitic ester plasticizers include triesters of trimellitic acid having Property (X) and/or Properties (Y); and tetraesters of pyromellitic acid having Property (X) and/or Properties (Y). Such triesters of trimellitic acid and tetraesters of pyromellitic acid are esters obtained by esterification of trimellitic acid or pyromellitic acid with a monohydric alcohol typified by an aliphatic monohydric alcohol. Preferred examples of the monohydric alcohol include aliphatic monohydric alcohols having eight or more carbon atoms, such as n-octyl alcohol, 2-ethylhexyl alcohol, isooctyl alcohol, nonyl alcohol, isononyl alcohol, decyl alcohol, isodecyl alcohol, undecyl alcohol, and dodecyl alcohol. Among them, aliphatic monohydric alcohols having eight to twelve carbon atoms are preferred, of which those having eight to ten carbon atoms are more preferred, and those having eight carbon atoms are especially preferred. Each of monohydric alcohols such as aliphatic monohydric alcohols can be used alone or in combination. These aliphatic monohydric alcohols may be any of straight-chain alcohols and branched-chain alcohols.

Specific examples of trimellitic ester plasticizers include trialkyl esters of trimellitic acid, such as tri(n-octyl) trimellitate, tri(2-ethylhexyl) trimellitate, triisooctyl trimellitate, triisononyl trimellitate, and triisodecyl trimellitate. Examples of pyromellitic ester plasticizers include tetraalkyl esters of pyromellitic acid, such as tetra(n-octyl) pyromellitate and tetra(2-ethylhexyl) pyromellitate.

The molecular weight of the plasticizer for use in the present invention is not particularly limited, but is preferably 500 or more, more preferably 520 or more, and particularly preferably 540 or more. When the plasticizer is a polymeric plasticizer such as a polyester plasticizer, the molecular weight herein is a weight-average molecular weight.

One or more pressure-sensitive adhesives for use in the foaming agent-free pressure-sensitive adhesive layer (A) are not particularly limited and can be selected as appropriate from among known pressure-sensitive adhesives. More specifically, examples of pressure-sensitive adhesives include acrylic pressure-sensitive adhesives, rubber pressure-sensitive adhesives, vinyl alkyl ether pressure-sensitive adhesives, silicone pressure-sensitive adhesives, polyester pressure-sensitive adhesives, polyamide pressure-sensitive adhesives, urethane pressure-sensitive adhesives, fluorine-containing pressure-sensitive adhesives, styrene-diene block copolymer pressure-sensitive adhesives, and pressure-sensitive adhesives having improved creeping property, which contain hot-melt resins having a melting point of about 200° C. or lower in addition to these pressure-sensitive adhesives. The pressure-sensitive adhesives further include radiation-curable pressure-sensitive adhesives and energy ray-curable pressure-sensitive adhesives. Each of these pressure-sensitive adhesives can be used alone or in combination.

Acrylic pressure-sensitive adhesives and rubber pressure-sensitive adhesives are preferably used as the pressure-sensitive adhesive, of which acrylic pressure-sensitive adhesives are more preferred. Examples of acrylic pressure-sensitive adhesives are acrylic pressure-sensitive adhesives each containing, as a base polymer, an acrylic polymer (homopolymer or copolymer) containing one or more alkyl esters of (meth) acrylic acid as monomer components. Examples of the alkyl esters of (meth)acrylic acid in the acrylic pressure-sensitive adhesives include alkyl esters of (meth)acrylic acid whose alkyl moiety has one to twenty carbon atoms, such as methyl (meth)acrylates, ethyl (meth)acrylates, propyl (meth)acrylates, isopropyl (meth)acrylates, butyl (meth)acrylates, isobutyl (meth)acrylates, s-butyl (meth)acrylates, t-butyl (meth)acrylates, pentyl (meth)acrylates, hexyl (meth)acrylates, heptyl (meth)acrylates, octyl (meth)acrylates, 2-ethylhexyl (meth)acrylates, isooctyl (meth)acrylates, nonyl (meth) acrylates, isononyl (meth)acrylates, decyl (meth)acrylates, isodecyl (meth)acrylates, undecyl (meth)acrylates, dodecyl (meth)acrylates, tridecyl (meth)acrylates, tetradecyl (meth) acrylates, pentadecyl (meth)acrylates, hexadecyl (meth)acrylates, heptadecyl (meth)acrylates, octadecyl (meth)acrylates, nonadecyl (meth)acrylates, and icosyl (meth)acrylates. Among them, straight- or branched-chain alkyl esters of (meth)acrylic acid whose alkyl moiety has four to eighteen carbon atoms are preferred.

Where necessary, these acrylic polymers may further contain units corresponding to one or more other monomer components that are copolymerizable with the alkyl esters of (meth)acrylic acid, for improving or modifying properties such as cohesion, thermal stability, and crosslinking capability. Examples of such monomer components include carboxyl-containing monomers such as acrylic acid, methacrylic acid, carboxyethyl acrylate, carboxypentyl acrylate, itaconic acid, maleic acid, fumaric acid, and crotonic acid; acid anhydride group-containing monomers such as maleic anhydride and itaconic anhydride; hydroxyl-containing monomers such as hydroxyethyl (meth)acrylates, hydroxypropyl (meth)acrylates, hydroxybutyl (meth)acrylates, hydroxyhexyl (meth) acrylates, hydroxyoctyl (meth)acrylates, hydroxydecyl (meth)acrylates, hydroxylauryl (meth)acrylates, and (4-hydroxymethylcyclohexyl)methyl methacrylate; sulfonic-containing monomers such as styrenesulfonic acid, allylsulfonic acid, 2-(meth)acrylamido-2-methylpropanesulfonic acid, (meth)acrylamidopropanesulfonic acid, sulfopropyl (meth) acrylates, and (meth)acryloyloxynaphthalenesulfonic acid; phosphate-containing monomers such as 2-hydroxyethylacryloyl phosphate; (N-substituted) amide monomers such as (meth)acrylamides, N,N-dimethyl(meth)acrylamides, N,N-diethyl(meth)acrylamides, N-isopropyl(meth)acrylamides, N-butyl(meth)acrylamides, N-methylol(meth)acrylamides, and N-methylolpropane(meth)acrylamides; aminoalkyl (meth)acrylate monomers such as aminoethyl (meth) acrylates, N,N-dimethylaminoethyl (meth)acrylates, and t-butylaminoethyl (meth)acrylates; alkoxyalkyl (meth)acrylate monomers such as methoxyethyl (meth)acrylates and ethoxyethyl (meth)acrylates; maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylenesuccinimides, N-(meth)acryloyl-6-oxyhexamethylenesuccinimides, and N-(meth)acryloyl-8-oxyoctamethylenesuccinimides; vinyl esters such as vinyl acetate and vinyl propionate; nitrogen-containing heterocyclic monomers such as N-vinyl-2-pyrrolidone, N-methylvinylpyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, N-(meth)acryloyl-2-pyrrolidone, N-(meth)acryloylpiperidine, N-(meth)acryloylpyrrolidine, and N-vinylmorpholine; N-vinylcarboxamides; styrenic monomers such as styrene and α-methylstyrene; lactam monomers such as N-vinylcaprolactam; cyano acrylate monomers such as acrylonitrile and methacrylonitrile; epoxy-containing acrylic monomers such as glycidyl (meth)acrylates; glycol acrylic ester monomers such as polyethylene glycol (meth)acrylates, polypropylene glycol (meth)acrylates, methoxyethylene glycol (meth)acrylates, and methoxypolypropylene glycol (meth) acrylates; acrylic ester monomers, containing a heterocyclic ring, a halogen atom, or a silicon atom, etc., such as tetrahydrofurfuryl (meth)acrylates, fluoro(meth)acrylates, and silico (meth)acrylates; polyfunctional monomers such as hexanediol di(meth)acrylates, (poly)ethylene glycol di(meth) acrylates, (poly)propylene glycol di(meth)acrylates, neopentyl glycol di(meth)acrylates, pentaerythritol di(meth) acrylates, trimethylolpropane tri(meth)acrylates, pentaerythritol tri(meth)acrylates, dipentaerythritol hexa(meth)acrylates, epoxy acrylates, polyester acrylates, urethane acrylates, divinylbenzene, butyl di(meth)acrylates, and hexyl di(meth) acrylates; olefinic monomers such as isoprene, butadiene, and isobutylene; and vinyl ether monomers such as methyl vinyl ether and ethyl vinyl ether. Each of these monomer components can be used alone or in combination.

Examples of the rubber pressure-sensitive adhesives include rubber pressure-sensitive adhesives containing naturally occurring rubbers or synthetic rubbers as base polymers. Examples of such synthetic rubbers include polyisoprene rubber, styrene-butadiene (SB) rubber, styrene-isoprene (SI) rubber, styrene-isoprene-styrene block copolymer (SIS) rubber, styrene-butadiene-styrene block copolymer (SBS) rubber, styrene-ethylene-butylene-styrene block copolymer (SEBS) rubber, styrene-ethylene-propylene-styrene block copolymer (SEPS) rubber, styrene-ethylene-propylene block copolymer (SEP) rubber, reclaimed rubber, butyl rubber, polyisobutylene, and modified products of these rubbers.

The pressure-sensitive adhesive may further contain suitable additives according to the type of the pressure-sensitive adhesive, in addition to polymer components such as a pressure-sensitive adhesive component (base polymer), and a plasticizer. Examples of such additives include crosslinking agents, tackifiers, pigments, dyestuffs, fillers, antioxidants, conductant agents, and antistatics.

Examples of crosslinking agents include isocyanate crosslinking agents, epoxy crosslinking agents, melamine crosslinking agents, and peroxide crosslinking agents, as well as urea crosslinking agents, metal alkoxide crosslinking agents, metal chelate crosslinking agents, metal salt crosslinking agents, carbodiimide crosslinking agents, oxazoline crosslinking agents, aziridine crosslinking agents, and amine crosslinking agents, of which isocyanate crosslinking agents and epoxy crosslinking agents are preferred. Example of the isocyanate crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; aromatic polyisocyanates such as 2,4-tolylene diisocyanate, 2,6-tolylene diisocyanate, 4,4'-diphenylmethane diisocyanate, and xylylene diisocyanate. In addition, an adduct of trimethylolpropane with tolylene diisocyanate trimer [available from Nippon Polyurethane Industry Co., Ltd. under the trade name of "Coronate L"] and an adduct of trimethylolpropane with hexamethylene diisocyanate trimer [available from Nippon Polyurethane Industry Co., Ltd. under the trade name of "Coronate HL"] may be used herein. Examples of the epoxy crosslinking agents include N,N,N', N'-tetraglycidyl-m-xylenediamine, diglycidylaniline, 1,3-bis (N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropane polyglycidyl ether, diglycidyl ester of adipic acid, diglycidyl ester of o-phthalic acid, triglycidyl-tris(2-hydroxyethyl) isocyanurate, resorcinol diglycidyl ether, and bisphenol-S-diglycidyl ether; and epoxy resins having two or more epoxy groups per molecule.

Examples of the tackifiers include rosin derivatives including, rosin, polymerized rosin, hydrogenated rosin, and derivatives of these, etc., such as rosin ester resins and hydrogenated rosin ester resins; terpene resins such as terpene resins, aromatic modified terpene resins, hydrogenated terpene resins, and terpene-phenol resins; phenolic resins such as phenol-formaldehyde resins and alkylphenol-formaldehyde resins; petroleum hydrocarbon resins including aliphatic petroleum resins, aromatic petroleum resins, and alicyclic petroleum resins prepared through hydrogenation of aromatic petroleum resins, etc., such as alicyclic saturated hydrocarbon resins; styrenic resins; and chroman resins such as chroman-indene resins.

The foaming agent-free pressure-sensitive adhesive layer (A) may be formed according to common procedures of, for example, mixing a pressure-sensitive adhesive, a plasticizer, and, where necessary, other components such as a solvent and additives and forming the mixture into a sheet-like layer. Specifically, the foaming agent-free pressure-sensitive-adhesive layer (A) may be prepared by processes of applying a mixture containing a pressure-sensitive adhesive, a plasticizer, and, where necessary, a solvent and other additives to a substrate, and drying or curing the applied layer according to necessity, or a process of applying the mixture to a suitable separator such as release paper to form a pressure-sensitive adhesive layer thereon, and transferring the pressure-sensitive adhesive layer to a substrate. The foaming agent-free pressure-sensitive adhesive layer (A) may have a single layer structure or a multilayer structure.

The thickness of the foaming agent-free pressure-sensitive adhesive layer (A) is not particularly limited, and can be selected within ranges of, for example, 5 to 200 μm, preferably 5 to 100 μm, and more preferably 10 to 50 μm.

In the present invention, the foaming agent-free pressure-sensitive adhesive layer (A) preferably has a ratio of X to Y (hereinafter also referred to as "X/Y ratio") of 20 or more, and more preferably 25 or more, in which the pressure-sensitive adhesive layer (A) has a shear adhesive strength of X ($N/cm^2$) with respect to a SUS 304BA stainless steel sheet in an adhesion area of 2.0 mm wide and 20 mm long as determined at a rate of pulling in a shear direction of 50 mm/minute, a temperature of 23±2° C., and a relative humidity of 65±5%, and the pressure-sensitive adhesive layer (A) has a tensile adhesive strength of Y (N/20 mm in width) with respect to a poly(ethylene terephthalate) film as determined at a peel angle of 180 degrees, a rate of pulling of 300 mm/minute, a temperature of 23±2° C., and a relative humidity of 65±5%. If the X/Y ratio is less than 20, there may be lateral displacement of the thermal-release double-coated pressure-sensitive adhesive tape or sheet, or of an adherend affixed to the foaming agent-containing pressure-sensitive adhesive layer (B) during processing of the adherend. Thus, processing may not be conducted with good accuracy.

In addition, in the present invention, the foaming agent-free pressure-sensitive adhesive layer (A) preferably has a shear adhesive strength of 10 ($N/cm^2$) or more, and more preferably 20 ($N/cm^2$) or more, with respect to a SUS 304BA stainless steel sheet in an adhesion area of 20 mm wide and 20 mm long as determined at a rate of pulling in a shear direction of 50 mm/minute, a temperature of 23±2° C., and a relative humidity of 65±5%. If the shear adhesive strength is less than 10 ($N/cm^2$), there may occur lateral displacement of the thermal-release double-coated pressure-sensitive adhesive tape or sheet, or of an adherend affixed to the foaming agent-containing pressure-sensitive adhesive layer (B) during processing of the adherend; and thus, processing may not be conducted with good accuracy, as in the case where the X/Y ratio is less than 20.

In the present invention, the foaming agent-free pressure-sensitive adhesive layer (A) preferably has a gel fraction of 75 percent by weight or more and more preferably has a gel fraction of 80 percent by weight or more. If the gel fraction is less than 75 percent by weight, there may occur lateral displacement of the thermal-release double-coated pressure-sensitive adhesive tape or sheet, or of an adherend affixed to the foaming agent-containing pressure-sensitive adhesive layer (B) during processing of the adherend; and thus, processing may not be conducted with good accuracy, even when the foaming agent-free pressure-sensitive adhesive layer (A) has a high shear adhesive strength.

The shear adhesive strength of the foaming agent-free pressure-sensitive adhesive layer (A) can be determined according to the following method of measuring shear adhesive strength.

[Method of Measuring Shear Adhesive Strength]

A sample thermal-release double-coated pressure-sensitive adhesive tape or sheet is cut to a piece 20 mm wide and 20 mm long, and the piece is affixed to a SUS 304 BA stainless steel sheet in an adhesion area 20 mm wide and 20 mm long under pressure according to the method specified in JIS Z 0237, by allowing a 5-kg roller to move to and fro thereon once at an ordinary temperature (23° C.±2° C.) and a relative humidity of 65±5% so that the foaming agent-free pressure-sensitive adhesive layer (A) is in contact with the SUS 304 BA stainless steel sheet; and the piece is further affixed to another SUS 304 BA stainless steel sheet in an adhesion area 20 mm wide and 20 mm long under pressure by allowing a 2-kg roller to move to and fro thereon once so that the foaming agent-containing pressure-sensitive adhesive layer (B) is in contact with the SUS 304 BA stainless steel sheet. The resulting tape or sheet with stainless steel sheets is kept at 23±2° C. for half an hour. In this stage, the foaming agent-free pressure-sensitive adhesive layer (A) lies between the two SUS 304 BA stainless steel sheets. After being kept, the load (maximum load) is measured while pulling the two SUS 304 BA stainless steel sheets in opposite directions from each other at a rate of pulling of 50 mm/min, a temperature of 23±2° C. and a relative humidity of 65±5%, and the shear adhesive strength ($N/cm^2$; with respect to a SUS 304BA stainless steel sheet in an adhesion area of 20 mm wide and 20 mm long at a rate of pulling in a shear direction of 50 mm/minute, a temperature of 23±2° C., and a relative humidity of 65±5%) is determined. The shear adhesive strength ($N/cm^2$) is determined by converting a measured value in an adhesion area of 4 $cm^2$ (20 mm wide and 20 mm long).

The X/Y ratio of the foaming agent-free pressure-sensitive adhesive layer (A) may be determined according to the following method of measuring X/Y ratio.

[Method of Measuring X/Y Ratio]

The tensile adhesive strength (Y) of a sample foaming agent-free pressure-sensitive adhesive layer (A) (with respect to a poly(ethylene terephthalate) film at a peel angle of 180 degrees, a rate of pulling of 300 mm/minute, a temperature of 23±2° C., and a relative humidity of 65±5%) is determined by the same procedure as in above-mentioned method of measuring tensile adhesive strength. The shear adhesive strength (X) of the foaming agent-free pressure-sensitive adhesive layer (A) (with respect to a SUS 304BA stainless steel sheet in an adhesion area of 20 mm wide and 20 mm long at a rate of pulling in a shear direction of 50 mm/minute, a temperature of 23±2° C., and a relative humidity of 65±5%; $N/cm^2$) is determined in the same manner as in the above method of measuring shear adhesive strength. The X/Y ratio is determined by calculation as the ratio of X to Y [X/Y].

[Substrate]

The substrate is used as a support or base in the thermal-release double-coated pressure-sensitive adhesive tape or sheet. Examples of the substrate include thin materials including paper substrates such as papers; fibrous substrates such as fabrics, nonwoven fabrics, and nets; metallic substrates such as metal foil and metal sheets; plastic substrates such as plastic films and sheets; rubber substrates such as rubber sheets; foams such as foamed sheets; and laminates of these, such as laminates of plastic substrates with other substrates, and laminates of plastic films or sheets. As the substrate, plastic substrates such as plastic films and sheets are preferably used. Materials for such plastic films and sheets include, for example, olefinic resins containing an α-olefin as a monomer component, such as polyethylenes (PE), polypropylenes (PP), ethylene-propylene copolymers, and ethylene-vinyl acetate copolymers (EVA); polyesters such as poly(ethylene terephthalate)s (PET), poly(ethylene naphthalate)s (PEN), and poly(butylene terephthalate)s (PBT); poly(vinyl chloride)s (PVC); poly(phenylene sulfide)s (PPS); amide resins such as polyamides (nylons) and wholly aromatic polyamides (aramids); and poly(ether ether ketone)s (PEEK). Each of these materials can be used alone or in combination.

A plastic substrate, if used as the substrate, may be subjected to processing such as stretching or orientation to control its deformation properties such as degree of elongation. When one or more radiation-curable materials are used in the foaming agent-free pressure-sensitive adhesive layer (A) and/or the foaming agent-containing pressure-sensitive adhesive layer (B), the substrate is preferably one that does not inhibit transmission of the radiation.

The thickness of the substrate can be set as appropriate according typically to the strength, flexibility, and usage, and is generally, but is not limited to, about 1000 μm or less, for example, about 1 to 1000 μm, preferably about 1 to 500 μm, more preferably about 3 to 300 μm, and particularly preferably about 5 to 250 μm. The substrate may have a single layer structure or a multilayer structure.

The surfaces of the substrate may be subjected to a common surface treatment and/or to a coating treatment with a primer so as to have improved adhesion to other layers such as the foaming agent-free pressure-sensitive adhesive layer (A) and the foaming agent-containing pressure-sensitive adhesive layer (B). Examples of the surface treatment include corona treatment, chromic acid treatment, exposure to ozone, exposure to flame, exposure to high tension electric shock, and oxidation treatment through chemical or physical process, such as treatment with ionizing radiation.

[Foaming Agent-Containing Pressure-Sensitive Adhesive Layer (B)]

The foaming agent-containing pressure-sensitive adhesive layer (B) is a pressure-sensitive adhesive layer containing a foaming agent and has a capability of expanding or foaming. Specifically, the foaming agent-containing pressure-sensitive adhesive layer (B) serves as a thermal-release pressure-sensitive adhesive layer (or heat-expandable pressure-sensitive adhesive layer). The foaming agent-containing pressure-sensitive adhesive layer (B) contains at least a pressure-sensitive adhesive and a foaming agent. Accordingly, when an article to be processed (hereinafter also referred to as article or adherend) is adhered and fixed to the foaming agent-containing pressure-sensitive adhesive layer (B) and subjected to a desired processing, the article is securely fixed to the foaming agent-containing pressure-sensitive adhesive layer (B), whereby the processing can be carried out smoothly. After processing, the foaming agent-containing pressure-sensitive adhesive layer (B) is heated so as to allow the foaming agent to foam and/or thermally expand, whereby the foaming agent-containing pressure-sensitive adhesive layer (B) expands. This expansion reduces the adhesion area (contact area) between the foaming agent-containing pressure-sensitive adhesive layer (B) and the processed article (adherend) and thereby reduces the adhesive strength of the foaming agent-containing pressure-sensitive adhesive layer (B). Thus, the processed article can be easily released from the thermal-release double-coated pressure-sensitive adhesive tape or sheet without any damage.

The foaming agent is not particularly limited, but is preferably a heat-expandable microsphere. Each of such foaming agents can be used alone or in combination. The heat-expandable microsphere may be selected as appropriate from among known heat-expandable microspheres. A foaming agent encapsulated in a microcapsule is preferably used as the heat-expandable microsphere. Examples of such heat-expandable microspheres include microspheres including an elastic shell and a material that easily gasifies and expands by heating, such as isobutane, propane, or pentane, and is encapsulated in the shell. The shell often contains a hot-melt material or a material that can break as a result of thermal expansion. Examples of the material constituting the shell include vinylidene chloride-acrylonitrile copolymers, poly(vinyl alcohol)s, poly(vinyl butyral)s, poly(methyl methacrylate)s, polyacrylonitriles, poly(vinylidene chloride)s, and polysulfones. These heat-expandable microspheres can be prepared according to a common procedure such as coacervation or interfacial polymerization. Such heat-expandable microspheres are also commercially available as products, such as products supplied from Matsumoto Yushi-Seiyaku Co., Ltd. under the trade name of "Matsumoto Microsphere".

Other foaming agents than heat-expandable microspheres can also be used as the foaming agent herein. Examples of such other foaming agents include foaming agents of every kind, such as inorganic foaming agents and organic foaming agents. Representative examples of inorganic foaming agents include ammonium carbonate, ammonium hydrogen carbonate, sodium-hydrogen carbonate, ammonium nitrite, sodium borohydride, and azides. Representative examples of organic foaming agents include water; chlorofluoro-alkane compounds such as trichloromonofluoromethane and dichloromonofluoromethane; azo compounds such as azobisisobutyronitrile, azodicarbonamide, and barium azodicarboxylate; hydrazine compounds such as p-toluenesulfonyl hydrazide, diphenylsulfone-3,3'-disulfonyl hydrazide, 4,4'-oxybis(benzenesulfonyl hydrazide), and allylbis(sulfonyl hydrazide); semicarbazide compounds such as p-toluoylenesulfonyl semicarbazide and 4,4'-oxybis(benzenesulfonyl semicarbazide); triazole compounds such as 5-morpholyl-1,2,3,4-thiatriazole; N-nitroso compounds such as N,N'-dinitrosopentamethylenetetramine and N,N'-dimethyl-N,N'-dinitrosoterephthalamide.

The foaming agent preferably does not blow out or burst until the coefficient of cubic expansion reaches 5 times or more, more preferably 7 times or more, and typically preferably 10 times or more to have a suitable strength. This contributes to efficient and stable reduction in adhesive strength of the foaming agent-containing pressure-sensitive adhesive layer (B) by heating.

The amount of the foaming agent, such as heat-expandable microspheres, can be set as appropriate according typically to the expansion ratio and reduction in adhesive strength of the foaming agent-containing pressure-sensitive adhesive layer (B). The amount is generally, for example, 1 to 150 parts by weight, preferably 10 to 130 parts by weight, and more preferably 25 to 100 parts by weight, to 100 parts by weight of a base polymer constituting the pressure-sensitive adhesive constituting the foaming agent-containing pressure-sensitive adhesive layer (B).

The pressure-sensitive adhesive for use in the foaming agent-containing pressure-sensitive adhesive layer (B) is not particularly limited and can be selected as appropriate from among known or common pressure-sensitive adhesives.

Examples of such pressure-sensitive adhesives include those exemplified as the pressure-sensitive adhesive for use in the foaming agent-free pressure-sensitive adhesive layer (A), such as acrylic pressure-sensitive adhesives, rubber pressure-sensitive adhesives, vinylalkyl ether pressure-sensitive adhesives, silicone pressure-sensitive adhesives, polyester pressure-sensitive adhesives, polyamide pressure-sensitive adhesives, urethane pressure-sensitive adhesives, fluorine-containing pressure-sensitive adhesives, styrene-diene block copolymer pressure-sensitive adhesives, pressure-sensitive adhesives having improved creeping property, and radiation-curable pressure-sensitive adhesives. Each of these pressure-sensitive adhesives can be used alone or in combination. The pressure-sensitive adhesive for use herein is preferably one that less restricts the foaming and/or expansion of the foaming agent, such as heat-expandable microspheres, upon expansion by heating of the foaming agent-containing pressure-sensitive adhesive layer (B).

Preferred examples of the pressure-sensitive adhesive include acrylic pressure-sensitive adhesives and rubber pressure-sensitive adhesives, of which acrylic pressure-sensitive adhesives are more preferred. Specific examples of acrylic pressure-sensitive adhesives and rubber pressure-sensitive adhesives can be found as the examples listed in the foaming agent-free pressure-sensitive adhesive layer (A).

The pressure-sensitive adhesive may further contain suitable additives according to the type of the pressure-sensitive adhesive, in addition to polymer components such as a pressure-sensitive adhesive component (base polymer). Examples of such additives include crosslinking agents, tackifiers, pigments, dyestuffs, fillers, antioxidants, conductant agents, antistatics, and plasticizers. Specific examples of the crosslinking agents and tackifiers can be found as the examples listed in the foaming agent-free pressure-sensitive adhesive layer (A).

The foaming agent-containing pressure-sensitive adhesive layer (B) may be formed according to a common procedure of, for example, mixing a pressure-sensitive adhesive, a foaming agent (e.g., heat-expandable microspheres), and where necessary other components such as a solvent and additives, and forming the mixture into a sheet-like layer. Specifically, the foaming agent-containing pressure-sensitive adhesive layer (B) may be prepared by a process of applying a mixture containing a pressure-sensitive adhesive, a foaming agent such as heat-expandable microspheres, and, where necessary, other components such as a solvent and additives to a substrate or an organic rubber-like elastic layer, and drying or curing the applied layer according to necessity. Alternatively, the layer (B) may be prepared by a process of applying the mixture to a suitable separator such as release paper to form a foaming agent-containing pressure-sensitive adhesive layer, and transferring the foaming agent-containing pressure-sensitive adhesive layer to a substrate or an organic rubber-like elastic layer. The foaming agent-containing pressure-sensitive adhesive layer (B) may have a single layer structure or a multilayer structure.

The thickness of the foaming agent-containing pressure-sensitive adhesive layer (B) can be selected as appropriate according typically to how much the adhesive strength should be reduced and is, for example, about 5 to 300 μm, and preferably about 20 to 150 μm. However, when heat-expandable microspheres are used as the foaming agent, the thickness of the foaming agent-containing pressure-sensitive adhesive layer (B) is preferably larger than the largest particle diameter of the heat-expandable microspheres. If the thickness of the foaming agent-containing pressure-sensitive adhesive layer (B) is excessively small, the heat-expandable microspheres may protrude from the surface of the layer and make the surface uneven, and this may reduce the adhesiveness of the layer before heating (before foaming or expansion). In addition, the foaming agent-containing pressure-sensitive adhesive layer (B) may not satisfactorily deform as a result of heating and may be unlikely to have smoothly reduced adhesive strength. In contrast, if the thickness of the foaming agent-containing pressure-sensitive adhesive layer (B) is excessively large, the foaming agent-containing pressure-sensitive adhesive layer (B) may often undergo cohesive failure after foaming or expansion through heating.

[Organic Rubber-Like Elastic Layer]

A thermal-release double-coated pressure-sensitive adhesive tape or sheet according to the present invention illustrated in FIG. 1B includes an organic rubber-like elastic layer arranged between the substrate and, the foaming agent-containing pressure-sensitive adhesive layer (B). This layer serves to impart deformation capability to the tape or sheet and improving the releasability thereof after heating. The organic rubber-like elastic layer may be arranged according to necessity, and is not necessarily arranged. The arrangement of the organic rubber-like elastic layer gives following advantages. When the thermal-release double-coated pressure-sensitive adhesive tape or sheet is affixed to an adherend, such as an article to be processed, through the foaming agent-containing pressure-sensitive adhesive layer (B), they can be adhered in a larger adhesion area, because the surface of the foaming agent-containing pressure-sensitive adhesive layer (B) in the thermal-release double-coated pressure-sensitive adhesive tape or sheet can satisfactorily follow the surface of the adherend. When the thermal-release double-coated pressure-sensitive adhesive tape or sheet is heated to thereby be removed from the adherend, the foaming agent-containing pressure-sensitive adhesive layer (B) can expand in a highly precisely controlled manner and can expand preferentially and uniformly in a thickness direction. Specifically, the organic rubber-like elastic layer serves to allow the surface of the thermal-release double-coated pressure-sensitive adhesive tape or sheet to follow the surface of an adherend to thereby provide a large adhesion area therebetween when the tape or sheet is affixed and adhered to the adherend. In addition, this layer also serves to reduce the restriction on foaming and/or expansion in a plane direction of the thermal-release double-coated pressure-sensitive adhesive tape or sheet to thereby promote the formation of a wavy structure due to change in three-dimensional structure of the foaming agent-containing pressure-sensitive adhesive layer (B), when the foaming agent-containing pressure-sensitive adhesive layer (B) is heated to foam or expand so as to release the adherend from the thermal-release double-coated pressure-sensitive adhesive tape or sheet.

The organic rubber-like elastic layer is preferably arranged between the foaming agent-containing pressure-sensitive adhesive layer (B) and the substrate so that the organic rubber-like elastic layer overlies the foaming agent-containing pressure-sensitive adhesive layer (B). It should be noted that the organic rubber-like elastic layer may be arranged at another position than between the substrate and the foaming agent-containing pressure-sensitive adhesive layer (B). The organic rubber-like elastic layer may be arranged on or above one or both sides of the substrate.

Preferred materials for constituting the organic rubber-like elastic layer include naturally occurring rubbers, synthetic rubbers, and synthetic resins having rubber elasticity, each of which has a Shore Durometer D scale of hardness according to ASTM D-2240 of, for example, preferably 50 or less, and more preferably 40 or less. Examples of the synthetic rubbers and synthetic resins having rubber elasticity include synthetic rubbers such as nitrile, diene, and acrylic synthetic rubbers; thermoplastic elastomers such as polyolefinic elastomers and polyester elastomers; and synthetic resins having rubber elasticity, such as ethylene-vinyl acetate copolymers, polyurethanes, polybutadienes, and flexible poly(vinyl chloride)s. Even polymers are originally rigid, such as poly(vinyl chloride)s, they can exhibit rubber elasticity by suitably using compounding ingredients such as plasticizers and flexibilizers, and these compositions can also be used as materials for constituting the organic rubber-like elastic layer. In addition, pressure-sensitive adhesive materials such as pressure-sensitive adhesives constituting the foaming agent-free pressure-sensitive adhesive layer (A) and the foaming agent-containing pressure-sensitive adhesive layer (B) may also be used as materials for constituting the organic rubber-like elastic layer.

Such an organic rubber-like elastic layer may be formed, for example, by a layer-forming procedure such as coating, dry lamination, or coextrusion. In the coating, a coating composition is applied to the substrate, which coating composition contains the material for constituting the organic rubber-like elastic layer, such as a naturally occurring rubber, a synthetic rubber, or a synthetic resin having rubber elasticity. In the dry lamination, a film is attached to the substrate, which film is a film composed of the material for constituting an organic rubber-like elastic layer, or is a multilayer film composed of one or more layers of the foaming agent-containing pressure-sensitive adhesive layer (B) and a layer composed of the material for constituting an organic rubber-like elastic layer arranged thereon. In the coextrusion, a resin-precursor composition containing material for constituting the substrate, and another resin-precursor composition containing material for constituting the organic rubber-like elastic layer are coextruded.

The thickness of the organic rubber-like elastic layer is, for example, about 5 to 300 μm, and preferably about 20 to 150 μm. If the organic rubber-like elastic layer has an excessively small thickness, the three-dimensional structure of the foaming agent-containing pressure-sensitive adhesive layer (B) may not sufficiently change after heating for expansion, whereby the adhered may be insufficiently released from the tape or sheet. The organic rubber-like elastic layer may have a single-layer structure or a multilayer structure.

The organic rubber-like elastic layer may be composed of a pressure-sensitive adhesive material mainly containing a naturally occurring rubber, a synthetic rubber, or a synthetic resin having rubber elasticity, or may be composed of, for example, a foamed film mainly containing such rubber components. The foaming herein can be carried out according to a common procedure such as mechanical agitation, use of a gas formed in a reaction, use of a foaming agent, removal of a soluble material, spraying, formation of a syntactic foam, or sintering.

When one or more radiation-curable materials are used in the foaming agent-free pressure-sensitive adhesive layer (A) and/or the foaming agent-containing pressure-sensitive adhesive layer (B), the organic rubber-like elastic layer is preferably one that does not inhibit transmission of the radiation.

[Other Layers]

A thermal-release double-coated pressure-sensitive adhesive tape or sheet according to the present invention may further include one or more other layers according to necessity. It may include, for example, one or more interlayers between the substrate and the foaming agent-free pressure-sensitive adhesive layer (A), and/or between the substrate and the foaming agent-containing pressure-sensitive adhesive layer (B). Examples of such interlayers include coating layers of treating agents such as release agents and primers; and layers for imparting or improving various properties and functions, such as a layer for increasing the adhesion area, a layer for increasing the adhesive strength, a layer for increasing the followability to the surface of the adherend, a layer for satisfactorily and smoothly reducing the adhesive strength, and a layer for improving the releasability.

[Separator]

In embodiments shown in FIGS. 1A and 1B, a separator (release liner) is used for protecting the surface (adhesive surface) of the foaming agent-free pressure-sensitive adhesive layer (A) and/or the foaming agent-containing pressure-sensitive adhesive layer (B). Such a separator may be used according to necessity, and is not necessarily used. The separator may be one having release surfaces on both sides as illustrated in FIGS. 1A and 1B, or one having a release surface on one side. A thermal-release double-coated pressure-sensitive adhesive tape or sheet according to the present invention may have one separator having release surfaces on both sides, or may have two separators each having a release surface on one or both sides thereof.

The separator is peeled off upon use of a pressure-sensitive adhesive layer which has been protected by the separator, such as the foaming agent-free pressure-sensitive adhesive layer (A) and/or the foaming agent-containing pressure-sensitive adhesive layer (B).

The separator can be, for example, a known or common release paper. Specific examples of separators usable herein include materials having a release agent layer such as plastic films and papers having a surface treated with one or more release agents such as silicone release agents, long-chain alkyl release agents, fluorine-containing release agents, and molybdenum sulfide release agents; materials having low adhesiveness and containing one or more fluorocarbon polymers such as polytetrafluoroethylenes, polychlorotrifluoroethylenes, poly(vinyl fluoride)s, poly(vinylidene fluoride)s, tetrafluoroethylene-hexafluoropropylene copolymers, and chlorofluoroethylene-(vinylidene fluoride) copolymers; and materials having low adhesiveness and containing one or more non-polar polymers such as olefinic resins (e.g., polyethylenes and polypropylenes). In a materials having a release agent layer, the surface of the release agent layer serves as a release surface. In a materials having low adhesiveness, the surface of the materials serves as a release surface.

These separators can be formed according to a known or common procedure, and the thicknesses thereof or the like are not particularly limited.

A thermal-release double-coated pressure-sensitive adhesive tape or sheet according to the present invention may be wound into a roll, or two or more plies of the tape or sheet may be stacked. A thermal-release double-coated pressure-sensitive adhesive tape or sheet in the form of a roll, for example, may be prepared by winding a tape or sheet with the foaming agent-containing pressure-sensitive adhesive layer (B) being protected by a separator having release surfaces on both sides, as illustrated in FIGS. 1A and 1B. It is naturally possible to prepare a thermal-release double-coated pressure-sensitive adhesive tape or sheet in the form of a roll even when both the foaming agent-free pressure-sensitive adhesive layer (A) and the foaming agent-containing pressure-sensitive adhesive layer (B) are protected by two different separators.

As is described above, each of thermal-release double-coated pressure-sensitive adhesive tapes or sheets according to the present invention can be in the form of, for example, a sheet or tape.

In the present invention, a thermal-release double-coated pressure-sensitive adhesive tape or sheet having the above-mentioned configuration is suitably usable as a pressure-sensitive adhesive tape or sheet for fixing an article to be processed upon processing. Specifically, an article to be processed (adherend) can be fixed to a support such as a pedestal through the thermal-release double-coated pressure-sensitive adhesive tape or sheet and can be processed while being fixed, by affixing the article to the foaming agent-containing pressure-sensitive adhesive layer (B), and affixing the foaming agent-free pressure-sensitive adhesive layer (A) to the support. The resulting fixed article can undergo processing. The process for processing the article can be freely selected. Examples of the process include processes of printing electrodes on green sheets, such as patterning process; lamination or stacking process; pressurization (pressing) process; cutting processes such as grinding process and dicing process; firing process; and assembly process.

After the completion of processing of the article, typically when the purpose of adhesion has been achieved or the adhesion is to be resolved, the article after processing (processed article) can be released (separated) and obtained from the tape or sheet by heating to a temperature equal to or higher than the foam initiating temperature of foaming agents in the foaming agent-containing pressure-sensitive adhesive layer (B) to thereby reduce the adhesive strength of the layer (B). The heating (heat treatment) for releasing or separating the processed article can be carried out, for example, using a suitable heating device such as a hot plate, a hot air dryer, a near-infrared lamp, or an air dryer. The heating temperature has only to be equal to or higher than the thermal-expansion initiating temperature (foam initiating temperature) of the foaming agent such as heat-expandable microspheres in the foaming agent-containing pressure-sensitive adhesive layer (B). This and other conditions for heating (heat treatment) can be set as appropriate according typically to how the adhesion area should be reduced depending on the surface condition of the article and the type of the foaming agent such as heat-expandable microspheres, how the substrate and the article are thermally stable, and how the heating is carried out (e.g., heat capacity and heating device). The heating is generally carried out at a temperature of 100° C. to 250° C., for 1 to 90 seconds typically using a hot plate, or for 5 to 15 minutes typically using a hot air dryer. The heating may be conducted in a suitable stage according to the purpose. In addition, an infrared lamp or heated water may be used as a heat source in some cases.

The thermal-release double-coated pressure-sensitive adhesive tape or sheet which has been fixed to a support through the foaming agent-free pressure-sensitive adhesive layer (A) can be easily removed from the support by peeling, after the article is processed and the processed article is released from the foaming agent-containing pressure-sensitive adhesive layer (B). The support can therefore be easily reused.

Even when the article is an electronic component or an analogue thereto, such as a semiconductor wafer or a semiconductor chip, the contamination of the article can be effectively suppressed or prevented, because the thermal-release double-coated pressure-sensitive adhesive tape or sheet has a loss in weight of plasticizer of 2 percent by weight or less upon heating of the tape or sheet at a temperature of 165° C. and a pressure of one atmosphere for one hour.

As is described above, a thermal-release double-coated pressure-sensitive adhesive tape or sheet according to the present invention can be suitably used as a thermal-release double-coated pressure-sensitive adhesive tape or sheet upon processing of an article. The thermal-release double-coated pressure-sensitive adhesive tape or sheet can also be used as a protecting member upon conveying or transportation of an adherend.

An article (adherend or article to be processed) to be affixed to the thermal-release double-coated pressure-sensitive adhesive tape or sheet can be freely selected. Examples of the adherend include electronic components or analogues thereto, such as silicon wafers and other semiconductor wafers, and semiconductor chips; electric articles such as ceramic capacitors and oscillators; display devices such as liquid crystal cells; thermal heads; solar cells; printed circuit boards such as multilayer ceramic sheets; and so-called "green sheets". Each of these adherends can be used alone or in combination.

Various processed articles (processed adherends) can be obtained by affixing the adherends or articles to the thermal-release double-coated pressure-sensitive adhesive tape or sheet and carrying out processing. For example, electronic components and circuit boards can be obtained as processed articles when electronic components or analogues thereto, such as semiconductor wafers, are used as adherends. Likewise, multilayer ceramic capacitors can be obtained as processed articles when green sheets for ceramic capacitors are used as adherends.

[Method of Processing Adherend]

In a method according to the present invention, an adherend (article) is processed by carrying out processing of the adherend while the thermal-release double-coated pressure-sensitive adhesive tape or sheet is fixed to a pedestal through the foaming agent-free pressure-sensitive adhesive layer (A), and the adherend is affixed to the foaming agent-containing pressure-sensitive adhesive layer (B). The process in the processing of the adherend can be freely selected and may include pressing process, stacking process, and cutting process in fabrication of electronic components; and grinding process and cutting process in fabrication of semiconductor components. More specifically, examples of the process to be applied to the adherend include processes of printing electrodes on green sheets, such as patterning process; stacking process; pressing process; cutting processes such as grinding process and dicing process; grinding processes such as back-grinding process; firing process; and assembly process.

When the thermal-release double-coated pressure-sensitive adhesive tape or sheet is to be removed from a pedestal such as a metallic pedestal after, for example, stacking process or cutting process, the thermal-release double-coated pressure-sensitive adhesive tape or sheet can be easily removed from the pedestal without damaging the adherend or processed article affixed to the foaming agent-containing pressure-sensitive adhesive layer (B).

After the completion of processing of the article, typically when the purpose of pressure-sensitive adhesion has been achieved or the adhesion is to be resolved, the adherend after processing (processed article) can be released or separated and thereby obtained from the tape or sheet by heating to a temperature equal to or higher than the foam initiating temperature of the foaming agent, such as heat-expandable microspheres, in the foaming agent-containing pressure-sensitive adhesive layer (B) to thereby reduce the adhesive strength of the layer (B).

The heating (heat treatment) for removing or separating the thermal-release double-coated pressure-sensitive adhesive tape or sheet from the processed adherend (processed article) can be carried out, for example, using a suitable heating device such as a hot plate, a hot air dryer, a near-infrared lamp, or an air dryer. The heating temperature has only to be equal to or higher than the thermal-expansion initiating temperature (foam initiating temperature) of the foaming agent, such as heat-expandable microspheres, in the foaming agent-containing pressure-sensitive adhesive layer (B). This and other conditions for heating (heat treatment) can be set as appropriate according typically to how the adhesion area reduces depending on the surface condition of the article and the type of the foaming agent such as heat-expandable microspheres, how the substrate and the article are thermally stable, and how the heating is carried out (e.g., heat capacity and heating device). The heating is generally carried out at a temperature of 100° C. to 250° C., for 1 to 90 seconds typically using a hot plate, or for 5 to 15 minutes typically using a hot air dryer. By heating under these conditions, the foaming agent such as heat-expandable microspheres in the foaming agent-containing pressure-sensitive adhesive layer (B) generally expands and/or foam, whereby the foaming agent-containing pressure-sensitive adhesive layer (B) expands and deforms to have an uneven surface to thereby have lowered adhesive strength or lose adhesive strength. The heating may be conducted in a suitable stage according to the purpose. In addition, an infrared lamp or heated water may be used as a heat source in some cases.

In the present invention, a pedestal (supporting pedestal) to be affixed to the thermal-release double-coated pressure-sensitive adhesive tape or sheet through the foaming agent-free pressure-sensitive adhesive layer (A) is not particularly limited, as long as it can support an adherend to be affixed to the foaming agent-containing pressure-sensitive adhesive layer (B). Any known or common pedestal for use in the processing of the subject adherend can be used. Specific examples of the pedestal include stainless steel sheets or plates, glass plates, and dummy wafers. The pedestal can be selected as appropriate according to what the adherend is and how the adherend is processed.

[Adherend]

In the present invention, an article (adherend or article to be processed) to be affixed to and held by the thermal-release double-coated pressure-sensitive adhesive tape or sheet can be freely selected. Specific examples of the adherend (article to be processed) include electronic components and analogues thereto, such as semiconductor wafers such as silicon wafers, and semiconductor chips; electric articles such as ceramic capacitors and oscillators; display devices such as liquid crystal cells; thermal heads; solar cells; printed circuit boards such as multilayer ceramic sheets; and so-called "green sheets". Each of these adherends can be used alone or in combination.

[Processed Adherend; Processed Article]

According to the present invention, various processed articles (processed adherends) can be obtained by affixing the adherends or articles to pedestals through the thermal-release double-coated pressure-sensitive adhesive tape or sheet and carrying out processing. For example, electronic components and circuit boards can be prepared as processed articles by using electronic components or analogues thereto, such as semiconductor wafers, as adherends (articles). Likewise, multilayer ceramic capacitors or the like can be prepared as processed articles by using green sheets for ceramic capacitors as adherends. Specifically, in the present invention, electronic components and multilayer ceramic capacitors are fabricated herein by using the thermal-release double-coated pressure-sensitive adhesive tape or sheet and by using the method of processing an adherend.

EXAMPLES

The present invention will be illustrated in further detail with reference to several examples below. It should be noted, however, these are illustrated only by way of example and never construed to limit the scope of the present invention.

Example 1

A resin-precursor composition (mixture) was applied to a polyester film (thickness: 100 μm) as a substrate, dried by heating at 120° C. for two minutes, and thereby yielded a pressure-sensitive adhesive layer (foaming agent-free pressure-sensitive adhesive layer) having a thickness after drying of 10 μm. A separator was then laminated on the foaming agent-free pressure-sensitive adhesive layer. The resin-precursor composition contained 100 parts by weight of an acrylic copolymer, 3 parts by weight of an isocyanate crosslinking agent (supplied from Nippon Polyurethane Industry Co., Ltd. under the trade name of "Coronate L"), 0.05 part by weight of a crosslinking catalyst (supplied from Tokyo Fine Chemical Co., Ltd. under the trade name of "EMBILIZER OL-1"), 10 parts by weight of a trimellitic ester plasticizer (supplied from Dainippon Ink and Chemicals, Inc. under the trade name of "MONOCIZER W700"; molecular weight: 546, boiling point: 430° C., pressure of saturated vapor at 100° C. 0.087 Pa, loss in weight on heating at 165° C. and atmospheric pressure (one atmosphere) for one hour: 0.1 percent by weight or less) as a plasticizer, and toluene as a solvent. The acrylic copolymer contained, as monomer components, 70 parts by weight of ethyl acrylate, 30 parts by weight of 2-ethylhexyl acrylate, 5 parts by weight of 2-hydroxyethyl acrylate, and 3 parts by weight of acrylic acid.

Next, a resin-precursor composition (mixture) was applied to a side of the substrate opposite to the foaming agent-free pressure-sensitive adhesive layer applied, dried by heating at 70° C. for three minutes, and thereby yielded a pressure-sensitive adhesive layer (foaming agent-containing pressure-sensitive adhesive layer) as a thermal-release pressure-sensitive adhesive layer, having a thickness after drying of 30 μm. A separator was laminated on the foaming agent-containing pressure-sensitive adhesive layer and thereby yielded a thermal-release double-coated pressure-sensitive adhesive tape or sheet. This had a layer structure of "(foaming agent-free pressure-sensitive adhesive layer)/(substrate)/(foaming agent-containing pressure-sensitive adhesive layer)". The resin-precursor composition contained 100 parts by weight of an acrylic copolymer, 2 parts by weight of an isocyanate crosslinking agent (supplied from Nippon Polyurethane Industry Co., Ltd. under the trade name of "Coronate L"), 0.05 part by weight of a crosslinking catalyst (supplied from Tokyo Fine Chemical Co., Ltd. under the trade name of "EMBILIZER OL-1"), 30 parts by weight of heat-expandable microspheres (supplied from Matsumoto Yushi-Seiyaku Co., Ltd. under the trade name of "Matsumoto Microsphere F-80SD"; foam initiating temperature: 150° C.) as a foaming agent, and toluene as a solvent. The acrylic copolymer contained, as monomer components, 70 parts by weight of ethyl acrylate, 30 parts by weight of 2-ethylhexyl acrylate, 5 parts by weight of 2-hydroxyethyl acrylate, and 3 parts by weight of acrylic acid.

Example 2

A thermal-release double-coated pressure-sensitive adhesive tape or sheet was prepared by the procedure of Example 1, except for using the isocyanate crosslinking agent (supplied from Nippon Polyurethane-Industry Co., Ltd. under the trade name of "Coronate L") in an amount of 2 parts by weight instead of 3 parts by weight, and using the trimellitic ester plasticizer (supplied from Dainippon Ink and Chemicals, Inc. under the trade name of "MONOCIZER W700") in an amount of 20 parts by weight instead of 10 parts by weight in the resin-precursor composition for constituting the foaming agent-free pressure-sensitive adhesive layer.

Comparative Example 1

A thermal-release double-coated pressure-sensitive adhesive tape or sheet was prepared by the procedure of Example 1, except for changing the amount of the trimellitic ester plasticizer (supplied from Dainippon Ink and Chemicals, Inc. under the trade name of "MONOCIZER W700") from 10 parts by weight to 0 part by weight, namely for not using the plasticizer, in the resin-precursor composition for constituting the foaming agent-free pressure-sensitive adhesive layer.

Comparative Example 2

A thermal-release double-coated pressure-sensitive adhesive tape or sheet was prepared by the procedure of Example 1, except for using the trimellitic ester plasticizer (supplied from Dainippon Ink and Chemicals, Inc. under the trade name of "MONOCIZER W700") in an amount of 70 parts by weight instead of 10 parts by weight in the resin-precursor composition for constituting the foaming agent-free pressure-sensitive adhesive layer.

Comparative Example 3

A thermal-release double-coated pressure-sensitive adhesive tape or sheet was prepared by the procedure of Example 1, except for using 10 parts by weight of a phthalic ester plasticizer (supplied from J-PLUS Co., Ltd., Yokkaichi, under the trade name of "DOP"; molecular weight: 390, boiling point: 386° C., pressure of saturated vapor at 100° C. 5 Pa, loss in weight on heating at 165° C. and atmospheric pressure for one hour: 10 percent by weight or less) instead of the trimellitic ester plasticizer (supplied from Dainippon Ink and Chemicals, Inc. under the trade name of "MONOCIZER W700") in the resin-precursor composition for constituting the foaming agent-free pressure-sensitive adhesive layer.

[Evaluation]

The thermal-release double-coated pressure-sensitive adhesive tapes or sheets prepared according to Examples 1 and 2 and Comparative Examples 1 to 3 were determined or evaluated, in the foaming agent-free pressure-sensitive adhesive layer, on the adhesive strength, the shear adhesive strength, the X/Y ratio, and the gel fraction, pedestal releasability, resistance to lateral displacement, and loss in weight on heating, according to the following measuring and evaluation methods.

[Method of Measuring Tensile Adhesive Strength]

A sample thermal-release double-coated pressure-sensitive adhesive tape or sheet is cut to a piece 20 mm wide and 140 mm long, a separator on the foaming agent-free pressure-sensitive adhesive layer is removed by peeling, and a poly(ethylene terephthalate) film (supplied from Toray Industries, Inc. under the trade name of "Lumirror S-10"; thickness: 25 µm, width: 30 mm) as an adherend is affixed to the foaming agent-free pressure-sensitive adhesive layer according to a procedure as described in Japanese Industrial Standards (JIS) Z 0237, under pressure by allowing a 2-kg roller to move to and fro thereon once in an atmosphere at a temperature of 23±2° C. and a relative humidity of 65±5%. The resulting film with the tape or sheet is placed in a tensile tester having a temperature chamber (supplied from Shimadzu Corporation under the trade names of "Shimadzu Autograph, Universal Testing Machine AG-1 20 kN") set at 23° C. and kept for thirty minutes. After being kept, the adherend is released by peeling from the thermal-release double-coated pressure-sensitive adhesive tape or sheet at a peel angle of 180 degrees and a rate of pulling of 300 mm/minute. The load upon removal is measured; the maximum of load (maximum of load other than a peak top in the initial stages of measurement) is read out; and the maximum of load is defined as the adhesive strength (tensile adhesive strength) (N/20 mm in width) of the foaming agent-free pressure-sensitive adhesive layer. The measured adhesive strengths are shown in "Tensile adhesive strength (N/20 mm in width)" in Table 1.

[Method of Measuring Shear Adhesive Strength]

A sample thermal-release double-coated pressure-sensitive adhesive tape or sheet is cut to a piece 20 mm wide and 20 mm long, a separator on the foaming agent-free pressure-sensitive adhesive layer is removed, and a SUS 304 BA stainless steel sheet (which has been ground with sand paper No. 360) as an adherend is affixed to the foaming agent-free pressure-sensitive adhesive layer in an adhesion area 20 mm wide and 20 mm long under pressure by allowing a 5-kg roller to move to and fro thereon once. The resulting steel sheet with the sample tape or sheet is kept at 23±2° C. for half an hour. After being kept, the load (maximum load) is measured while pulling the SUS 304 BA stainless steel sheet and the thermal-release double-coated pressure-sensitive adhesive tape or sheet in opposite directions as illustrated in FIG. 2 at a rate of pulling of 50 mm/min in an atmosphere at a temperature of 23±2° C. and a relative humidity of 65±5%, and the shear adhesive strength (N/cm$^2$) of the foaming agent-free pressure-sensitive adhesive layer is determined.

Figure 2:
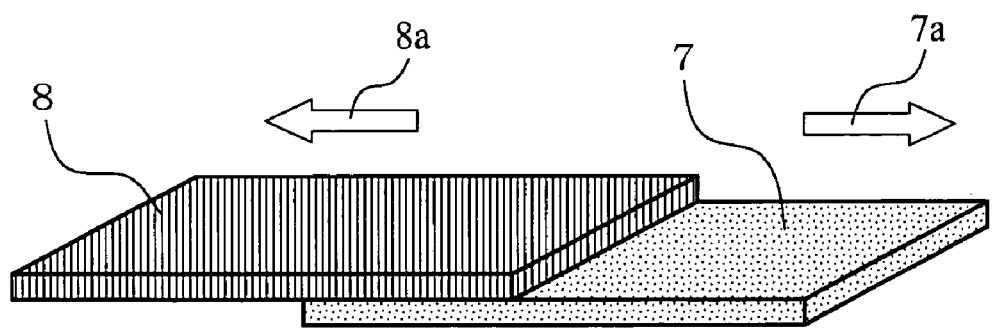
FIG. 2 is a schematic diagram showing a pulling direction upon measurement of the shear adhesive strength of a thermal-release double-coated pressure-sensitive adhesive tape or sheet.

FIG. 2 is a schematic diagram showing a pulling direction upon measurement of the shear adhesive strength of a thermal-release double-coated pressure-sensitive adhesive tape or sheet. In FIG. 2, "7" represents a thermal-release double-coated pressure-sensitive adhesive tape or sheet, "7a" represents a pulling direction of the thermal-release double-coated pressure-sensitive adhesive tape or sheet 7, "8" represents a SUS 304 BA stainless steel sheet, and "8a" represents a pulling direction of the SUS 304 BA stainless steel sheet 8. In FIG. 2, the SUS 304 BA stainless steel sheet 8 has been affixed to the foaming agent-free pressure-sensitive adhesive layer of the thermal-release double-coated pressure-sensitive adhesive tape or sheet 7 in an adhesion area of 20 mm long and 20 mm wide, and the thermal-release double-coated pressure-sensitive adhesive tape or sheet 7 is pulled in the pulling direction 7a, namely, in the right direction in FIG. 2, and the SUS 304 BA stainless steel sheet 8 is pulled in the pulling direction 8a, namely in the left direction in FIG. 2, respectively, at a rate of pulling of 50 mm/min.

[Method of Measuring X/Y Ratio]

On a sample thermal-release double-coated pressure-sensitive adhesive tape or sheet, the tensile adhesive strength (Y) (N/20 mm in width) of the foaming agent-free pressure-sensitive adhesive layer is determined by the same procedure as in the above method of measuring tensile adhesive strength, with respect to a poly(ethylene terephthalate) film at a peel angle of 180 degrees, a rate of pulling of 300 mm/minute, a temperature of 23±2° C., and a relative humidity of 65±5%. The shear adhesive strength (X) (N/cm$^2$) of the foaming agent-free pressure-sensitive adhesive layer is determined in the same manner as in the above method of measuring shear adhesive strength, with respect to a SUS 304BA stainless steel sheet in an adhesion area of 20 mm wide and 20 mm long at a rate of pulling in a shear direction of 50 mm/minute, a temperature of 23±2° C., and a relative humidity of 65±5%. The X/Y ratio is determined by calculation as the ratio of X to Y [X/Y].

[Method of Measuring Gel Fraction]

A pressure-sensitive adhesive composition for forming a foaming agent-free pressure-sensitive adhesive layer is applied to a release liner and dried by heating at 120° C. for two minutes to form a foaming agent-free pressure-sensitive adhesive layer. The foaming agent-free pressure-sensitive adhesive layer is weighed to determine its weight, and this weight is defined as a weight before immersion (A). Next, the foaming agent-free pressure-sensitive adhesive layer is immersed in toluene at ordinary temperature (23±2° C.) for seventy-two hours, an unsolved portion is taken out, from which toluene is completely distilled off typically in an oven, the dried unsolved portion is weighed to determine its weight, and this weight is defined as a weight after immersion (B).

A gel fraction is determined by calculation according to following Equation (1):

$$\text{Gel fraction(percent by weight)} = (B/A) \times 100 \quad (1)$$

wherein "A" represents the weight before immersion; and "B" represents the weight after immersion.

[Method of Evaluating Pedestal Releasability]

A sample is prepared by cutting a thermal-release double-coated pressure-sensitive adhesive tape or sheet to a piece 100 mm wide and 100 mm long. The sample is affixed to a SUS 304 BA stainless steel sheet so that the foaming agent-free pressure-sensitive adhesive layer is in contact with the SUS 304 BA stainless steel sheet, under pressure by allowing a 2-kg roller to move to and fro thereon once. A commercially available aluminum foil (80 mm wide and 80 mm long) is affixed to the foaming agent-containing pressure-sensitive adhesive layer so as not to cause wrinkles. The resulting article is heated at 60° C. for two hours, cooled to ordinary temperature (23±2° C.), and one of four corners of the sample (thermal-release double-coated pressure-sensitive adhesive tape or sheet) is peeled from the pedestal (SUS 304 BA stainless steel sheet) in a direction perpendicular to the pedestal at a rate of 50 mm/min. Whether there occurs buckling or wrinkling of the aluminum foil is visually observed, and the pedestal releasability is evaluated according to the following criteria.

Criteria of Pedestal Releasability:
○: The aluminum foil is free from buckling and wrinkling
x: The aluminum foil shows buckling and/or wrinkling

[Method of Evaluating Resistance to Lateral Displacement]

A sample is prepared by cutting a thermal-release double-coated pressure-sensitive adhesive tape or sheet to a piece 10 mm wide and 100 mm long. The sample is affixed to a SUS 304 BA stainless steel sheet in an adhesion area of 10 mm wide and 20 mm long so that the foaming agent-free pressure-sensitive adhesive layer is in contact with the SUS 304 BA stainless steel sheet, under pressure by allowing a 2-kg roller to move to and fro thereon once. A load of 5 N is placed thereon at 40±4° C., and, in addition, a load of 5 N force in a shear direction is applied to an end of the sample thermal-release double-coated pressure-sensitive adhesive tape or sheet not applied to the SUS 304 BA stainless steel sheet. The article is kept under this condition for one hour, and the displacement (mm) of the thermal-release double-coated pressure-sensitive adhesive tape or sheet is measured. The resistance to lateral displacement is evaluated according to the following criteria.

Criteria of Resistance to Lateral Displacement:
○: The displacement is less than 0.2 mm.
x: The displacement is 0.2 mm or more.

[Method of Measuring Loss in Weight on Heating]

A sample thermal-release double-coated pressure-sensitive adhesive tape or sheet (width: 20 mm, length: 50 mm) from which two separators have been removed is placed in a vial, heated at a temperature of 165° C. and a pressure of one atmosphere for one hour, 1.0 mL of a gas under heating is injected into a gas chromatographic measuring system and gas chromatography is carried out under following conditions. Thus, the weight of vaporized or volatilized plasticizer is measured, and the loss in weight of plasticizer (weight reduction) in the thermal-release double-coated pressure-sensitive adhesive tape or sheet is determined by calculation. The determined losses in weight on heating (loss in weight on heating at 165° C. and atmospheric pressure for one hour) are shown as "Loss in weight on heating" in Table 1.

Gas Chromatographic Measuring Conditions:

Carrier gas and flow rate thereof: helium (He) gas, 7.9 mL/min

Column head pressure: 34.5 kPa (at 40° C.)

Temperature at injection port: 280° C.

Column temperature: at 40° C. for 5 minutes, elevated at a rate of 10° C./minute, and at 260° C. for 13 minutes Detector: FID (280° C.)

Pressurization time: 0.12 minute

Loop filling time: 0.12 minute

Loop equilibration time: 0.12 minute

Injection time: 3.00 minute

Temperature of sample loop: 200° C.

Temperature of transfer line: 220° C.

TABLE 1

| | Example | | Comparative Example | | |
|---|---|---|---|---|---|
| | 1 | 2 | 1 | 2 | 3 |
| Tensile adhesive strength (N/20 mm in width) | 0.8 | 0.7 | 5.1 | 0.1 | 0.9 |
| Shear adhesive strength (N/20 cm$^2$) | 33 | 21 | 48 | 8 | 39 |
| X/Y ratio | 41.3 | 30.0 | 9.4 | 80.0 | 43.3 |
| Gel fraction (% by weight) | 88 | 82 | 93 | 58 | 65 |
| Pedestal releasability | ○ | ○ | x | ○ | ○ |
| Resistance to lateral displacement | ○ | ○ | ○ | x | ○ |
| Loss in weight on heating (% by weight) | 0.3 | 0.7 | — | 2.1 | 7.9 |

As is demonstrated in Table 1, the thermal-release double-coated pressure-sensitive adhesive tapes or sheets according to Examples 1 and 2 can be more easily removed from an adherend such as a support, than the thermal-release double-coated pressure-sensitive adhesive tape or sheet according to Comparative Example 1 is. This is because the tapes or sheets of Examples 1 and 2 each contain a specific amount of a plasticizer in the foaming agent-free pressure-sensitive adhesive layer and thereby have an adhesive strength of the foaming agent-free pressure-sensitive adhesive layer reduced to a suitable range. In addition, the tapes or sheets of Examples 1 and 2 do not cause contamination of the adherend even though they contain a plasticizer in the foaming agent-free pressure-sensitive adhesive layer. This is because they each have a loss in weight of plasticizer on heating of 2 percent by weight or less upon heating of the tapes or sheets at 165° C. and atmospheric pressure for one hour; and the plasticizer less vaporizes or volatilizes when the adherend (article) affixed to the foaming agent-containing pressure-sensitive adhesive layer is processed at high temperatures or when the processed article is released from the foaming agent-containing pressure-sensitive adhesive layer by heating.

In contrast, when a foaming agent-free pressure-sensitive adhesive layer contains no plasticizer as in the thermal-release double-coated pressure-sensitive adhesive tape or sheet according to Comparative Example 1, the foaming agent-free pressure-sensitive adhesive layer has an excessively high adhesive strength, whereby the thermal-release double-coated pressure-sensitive adhesive tape or sheet is not satisfactorily or smoothly removed from an adherend such as a support, namely, it has poor articleability. When a foaming agent-free pressure-sensitive adhesive layer contains a plasticizer in excess as in the thermal-release double-coated pressure-sensitive adhesive tape or sheet according to Comparative Example 2, the foaming agent-free pressure-sensitive adhesive layer has an excessively low adhesive strength, whereby the foaming agent-free pressure-sensitive adhesive layer may be peeled from a support during processing of an adherend (article) affixed to the foaming agent-containing pressure-sensitive adhesive layer. When a foaming agent-free pressure-sensitive adhesive layer contains a phthalic ester plasticizer as in the thermal-release double-coated pressure-sensitive adhesive tape or sheet according to Comparative Example 3, the plasticizer shows a large loss in weight on heating, whereby the plasticizer may vaporize or volatilize and cause contamination of the adherend when the adherend (article) affixed to the foaming agent-containing pressure-sensitive adhesive layer is processed at high temperatures or when the processed article is released from the foaming agent-containing pressure-sensitive adhesive layer by heating.

These results demonstrate that there can be obtained thermal-release double-coated pressure-sensitive adhesive tapes or sheets, which have such a suitably reduced adhesive strength of a foaming agent-free pressure-sensitive adhesive layer serving as a pressure-sensitive adhesive layer to be affixed to a support so as to be easily removed from the support by peeling, and which are free from or substantially free from contamination of the adherend. The tapes or sheets are obtained by using, as a plasticizer, one having a loss in weight of 2 percent by weight or less upon heating at a temperature of 165° C. and a pressure of one atmosphere for one hour and/or having a pressure of saturated vapor at 100° C. of 0.09 Pa or less and a boiling point of 400° C. or higher.

It should be understood by those skilled in the art that various modifications, combinations, subcombinations, and alterations may occur depending on design requirements and other factors insofar as they are within the scope of the appended claims or the equivalents thereof.

What is claimed is:

1. A thermal-release double-coated pressure-sensitive adhesive tape or sheet, comprising:
   a substrate;
   a pressure-sensitive adhesive layer (A) containing no foaming agent and being arranged on or above one side of the substrate; and
   another pressure-sensitive adhesive layer (B) containing a foaming agent and being arranged on or above the other side of the substrate,
   wherein the pressure-sensitive adhesive layer (A) contains:
      5 to 30 parts by weight of the plasticizer; and
      100 parts by weight of a base polymer,
   wherein the pressure-sensitive adhesive layer (A) has a tensile adhesive strength of 1 N/20 mm in width or less with respect to a poly(ethylene terephthalate) film as determined at a peel angle of 180 degrees, a rate of pulling of 300 mm/minute, a temperature of 23±2° C., and a relative humidity of 65±5%, and
   wherein the pressure-sensitive adhesive double-coated tape or sheet has a loss in weight of the plasticizer of 2 percent by weight or less upon heating of the double-coated pressure-sensitive adhesive tape or sheet at a temperature of 165° C. and a pressure of one atmosphere for one hour.

2. A thermal-release double-coated pressure-sensitive adhesive tape or sheet according to claim 1, wherein the plasticizer has the following Property (X) and/or Properties (Y):
   Property (X): a loss in weight of 2 percent by weight or less upon heating at a temperature of 165° C. and a pressure of one atmosphere for one hour; and
   Properties (Y): a pressure of saturated vapor at 100° C. of 0.09 Pa or less and a boiling point of 400° C. or higher.

3. A thermal-release double-coated pressure-sensitive adhesive tape or sheet according to claim 1, wherein the plasticizer has a molecular weight or weight-average molecular weight of 500 or more.

4. A thermal-release double-coated pressure-sensitive adhesive tape or sheet according to claim 1, wherein the plasticizer comprises at least one of a trimellitic ester plasticizer and a pyromellitic ester plasticizer.

5. A thermal-release double-coated pressure-sensitive adhesive tape or sheet according to claim 1,
   wherein the pressure-sensitive adhesive layer (A) has a shear adhesive strength of X (N/cm$^2$) with respect to a SUS 304BA stainless steel sheet in an adhesion area of 20 mm wide and 20 mm long as determined at a rate of pulling in a shear direction of 50 mm/minute, a temperature of 23±2° C., and a relative humidity of 65±5%,
   wherein the pressure-sensitive adhesive layer (A) has a tensile adhesive strength of Y (N/20 mm in width) with respect to a poly(ethylene terephthalate) film as determined at a peel angle of 180 degrees, a rate of pulling of 300 mm/minute, a temperature of 23±2° C., and a relative humidity of 65±5%, and
   wherein the ratio of X to Y (X/Y) is 20 or more.

6. A thermal-release double-coated pressure-sensitive adhesive tape or sheet according to claim 1, wherein the pressure-sensitive adhesive layer (A) has a shear adhesive strength of 10 (N/cm$^2$) or more with respect to a SUS 304BA stainless steel sheet in an adhesion area of 20 mm wide and 20 mm long as determined at a rate of pulling in a shear direction of 50 mm/minute, a temperature of 23±2° C., and a relative humidity of 65±5%.

7. A thermal-release double-coated pressure-sensitive adhesive tape or sheet according to claim 1, wherein the pressure-sensitive adhesive layer (A) has a gel fraction of 75 percent by weight or more.

8. A method of processing an adherend using a pressure-sensitive adhesive double-coated tape or sheet, the method comprising the steps of:
fixing the thermal-release double-coated pressure-sensitive adhesive tape or sheet of claim 1 to a pedestal through the pressure-sensitive adhesive layer (A);
affixing the adherend to the pressure-sensitive adhesive layer (B) of the thermal-release double-coated pressure-sensitive adhesive tape or sheet; and
carrying out processing of the adherend being affixed to the pressure-sensitive adhesive layer (B) of the tape or sheet being fixed to the pedestal.

9. A method according to claim 8, wherein the adherend is an electronic component or an analogue thereto.

10. A method according to claim 8,
wherein the adherend is a green sheet for a ceramic capacitor, and
wherein the method further comprises the step of stacking, on the green sheet, another green sheet.

11. A thermal-release double-coated pressure-sensitive adhesive tape or sheet according to claim 2, wherein the plasticizer has a molecular weight or weight-average molecular weight of 500 or more.

12. A thermal-release double-coated pressure-sensitive adhesive tape or sheet according to claim 2, wherein the plasticizer comprises at least one of a trimellitic ester plasticizer and a pyromellitic ester plasticizer.

13. A thermal-release double-coated pressure-sensitive adhesive tape or sheet according to claim 2,
wherein the pressure-sensitive adhesive layer (A) has a shear adhesive strength of X (N/cm$^2$) with respect to a SUS 304BA stainless steel sheet in an adhesion area of 20 mm wide and 20 mm long as determined at a rate of pulling in a shear direction of 50 mm/minute, a temperature of 23±2° C., and a relative humidity of 65±5%,
wherein the pressure-sensitive adhesive layer (A) has a tensile adhesive strength of Y (N/20 mm in width) with respect to a poly(ethylene terephthalate) film as determined at a peel angle of 180 degrees, a rate of pulling of 300 mm/minute, a temperature of 23±2° C., and a relative humidity of 65±5%, and
wherein the ratio of X to Y (X/Y) is 20 or more.

14. A thermal-release double-coated pressure-sensitive adhesive tape or sheet according to claim 2, wherein the pressure-sensitive adhesive layer (A) has a shear adhesive strength of 10 (N/cm$^2$) or more with respect to a SUS 304BA stainless steel sheet in an adhesion area of 20 mm wide and 20 mm long as determined at a rate of pulling in a shear direction of 50 mm/minute, a temperature of 23±2° C., and a relative humidity of 65±5%.

15. A thermal-release double-coated pressure-sensitive adhesive tape or sheet according to claim 2, wherein the pressure-sensitive adhesive layer (A) has a gel fraction of 75 percent by weight or more.

16. A method of processing an adherend using a pressure-sensitive adhesive double-coated tape or sheet, the method comprising the steps of:
fixing the thermal-release double-coated pressure-sensitive adhesive tape or sheet of claim 2 to a pedestal through the pressure-sensitive adhesive layer (A);
affixing the adherend to the pressure-sensitive adhesive layer (B) of the thermal-release double-coated pressure-sensitive adhesive tape or sheet; and
carrying out processing of the adherend being affixed to the pressure-sensitive adhesive layer (B) of the tape or sheet being fixed to the pedestal.

17. A method of processing an adherend using a pressure-sensitive adhesive double-coated tape or sheet, the method comprising the steps of:
fixing the thermal-release double-coated pressure-sensitive adhesive tape or sheet of claim 3 to a pedestal through the pressure-sensitive adhesive layer (A);
affixing the adherend to the pressure-sensitive adhesive layer (B) of the thermal-release double-coated pressure-sensitive adhesive tape or sheet; and
carrying out processing of the adherend being affixed to the pressure-sensitive adhesive layer (B) of the tape or sheet being fixed to the pedestal.

18. A method of processing an adherend using a pressure-sensitive adhesive double-coated tape or sheet, the method comprising the steps of:
fixing the thermal-release double-coated pressure-sensitive adhesive tape or sheet of claim 4 to a pedestal through the pressure-sensitive adhesive layer (A);
affixing the adherend to the pressure-sensitive adhesive layer (B) of the thermal-release double-coated pressure-sensitive adhesive tape or sheet; and
carrying out processing of the adherend being affixed to the pressure-sensitive adhesive layer (B) of the tape or sheet being fixed to the pedestal.

\* \* \* \* \*